(12) United States Patent
Watanabe et al.

(10) Patent No.: US 10,872,673 B2
(45) Date of Patent: Dec. 22, 2020

(54) SEMICONDUCTOR MEMORY DEVICE

(71) Applicant: TOSHIBA MEMORY CORPORATION, Tokyo (JP)

(72) Inventors: Toshifumi Watanabe, Yokohama Kanagawa (JP); Naofumi Abiko, Kawasaki Kanagawa (JP); Mario Sako, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/552,828

(22) Filed: Aug. 27, 2019

(65) Prior Publication Data

US 2020/0194087 A1      Jun. 18, 2020

(30) Foreign Application Priority Data

Dec. 14, 2018   (JP) ................................ 2018-234403

(51) Int. Cl.
```
G11C 16/26      (2006.01)
G11C 16/08      (2006.01)
G11C 16/10      (2006.01)
G11C 7/08       (2006.01)
G11C 16/30      (2006.01)
G11C 16/34      (2006.01)
G11C 16/24      (2006.01)
```
(52) U.S. Cl.
CPC ................ *G11C 16/26* (2013.01); *G11C 7/08* (2013.01); *G11C 16/08* (2013.01); *G11C 16/10* (2013.01); *G11C 16/24* (2013.01); *G11C 16/30* (2013.01); *G11C 16/3459* (2013.01)

(58) Field of Classification Search
CPC ........... G11C 16/26; G11C 16/10; G11C 7/08; G11C 16/08; G11C 16/24; G11C 16/30; G11C 16/3459
USPC ..................................................... 365/185.23
See application file for complete search history.

(56) References Cited

U.S. PATENT DOCUMENTS

| | | | |
|---|---|---|---|
| 8,817,542 B2 * | 8/2014 | Kato ................... | G11C 11/5642 365/185.18 |
| 9,524,787 B2 * | 12/2016 | Maejima ............. | G11C 11/5628 |
| 10,186,323 B2 | 1/2019 | Maejima | |
| 10,249,372 B2 * | 4/2019 | Chen ...................... | G11C 16/26 |
| 2016/0276034 A1 * | 9/2016 | Maejima ............. | G11C 11/5628 |
| 2017/0084347 A1 | 3/2017 | Kavalipurapu et al. | |

FOREIGN PATENT DOCUMENTS

JP          2018-045749 A          3/2018

* cited by examiner

*Primary Examiner* — Fernando Hidalgo
(74) *Attorney, Agent, or Firm* — Kim & Stewart LLP

(57) ABSTRACT

A semiconductor memory cell includes a memory cell, a word line and a source line both connected to the memory cell, and a control circuit. During a read operation on the memory cell, the control circuit applies a first voltage to the word line, applies a second voltage greater than the first voltage to the word line, and then applies a third voltage which is greater than the first voltage and smaller than the second voltage to the word line. During the read operation on the memory cell, the control circuit also applies a fourth voltage to the source line according to a timing at which the second voltage is applied to the word line, and then applies a fifth voltage smaller than the fourth voltage to the source line.

17 Claims, 16 Drawing Sheets

SEMICONDUCTOR MEMORY DEVICE

CROSS-REFERENCE TO RELATED APPLICATION(S)

This application is based upon and claims the benefit of priority from Japanese Patent Application No. 2018-234403, filed Dec. 14, 2018, the entire contents of which are incorporated herein by reference.

FIELD

Embodiments described herein relate generally to a semiconductor memory device.

BACKGROUND

A NAND-type flash memory is known as a semiconductor memory device.

DETAILED DESCRIPTION

Figure 1:
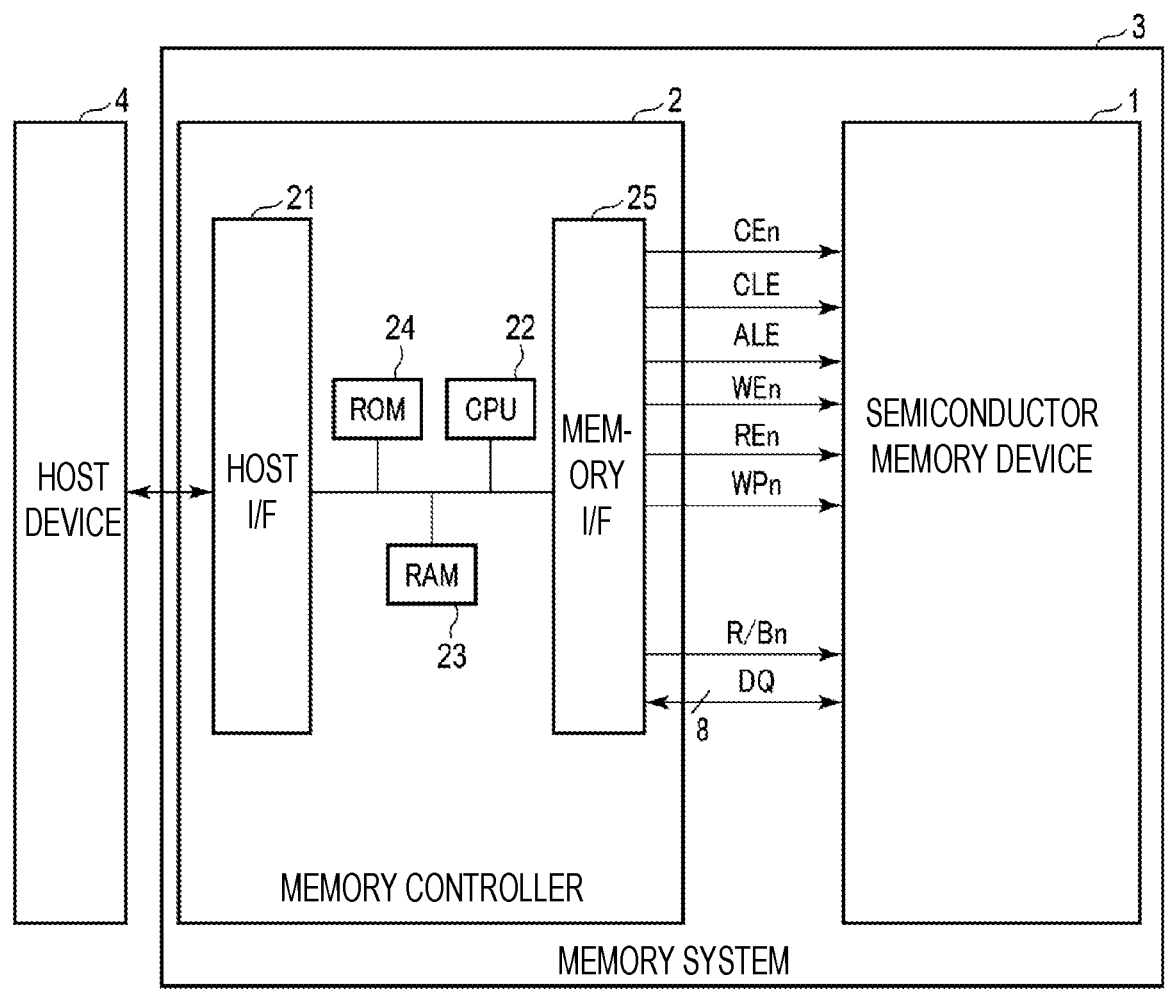
FIG. 1 is a block diagram illustrating an example of a configuration of a memory system including a semiconductor memory device according to a first embodiment.

Embodiments provide a semiconductor memory device capable of high speed operation.

In general, according to one embodiment, the semiconductor memory device includes a memory cell, a word line connected to the memory cell, a source line connected to the memory cell, and a control circuit. During a read operation on the memory cell, the control circuit applies a first voltage to the word line, applies a second voltage greater than the first voltage to the word line after applying the first voltage to the word line, and applies a third voltage which is greater than the first voltage and smaller than the second voltage to the word line after applying the second voltage to the word line. During the read operation on the memory cell, the control circuit also applies a fourth voltage to the source line according to a timing at which the second voltage is applied to the word line, and applies a fifth voltage smaller than the fourth voltage to the source line after applying the fourth voltage to the source line.

Hereinafter, embodiments will be described with reference to the accompanying drawings. In the following description, elements having the same function and configuration are denoted by the same reference numerals. In addition, when plural elements having the same reference numeral are distinguished from each other, they are distinguished from each other by adding suffixes to the common reference numeral. Further, in a case where the elements do not need to be distinguished from each other, only the common reference numeral is used.

First Embodiment

A semiconductor memory device 1 according to a first embodiment will be described below.

Configuration Example (1) Memory System

FIG. 1 is a block diagram illustrating an example of a configuration of a memory system 3 including the semiconductor memory device 1 according to the first embodiment.

As illustrated in FIG. 1, the memory system 3 includes the semiconductor memory device 1 and a memory controller 2, and is connected to a host device 4. The memory system 3 is, for example, a solid state drive (SSD) or an SD™ card.

The semiconductor memory device 1 is controlled by the memory controller 2. The memory controller 2 receives an instruction from the host device 4 and controls the semiconductor memory device 1 based on the received instruction.

The memory controller 2 includes a host interface circuit 21, a central processing unit (CPU) 22, a random access memory (RAM) 23, a read only memory (ROM) 24, and a memory interface circuit 25. The memory controller 2 is configured as, for example, a system-on-a-chip (SoC).

The ROM 24 stores firmware (more generally, a program) The RAM 23 may store the firmware and is used as a work area of the CPU 22. The RAM 23 further stores data temporarily and functions as a buffer and a cache. The firmware which is stored in the ROM 24 and loaded into the RAM 23 is executed by the CPU 22. As a result, the memory controller 2 executes various operations including a read operation and a write operation, which will be described later, and a part of the functions of the host interface circuit 21 and the memory interface circuit 25.

The host interface circuit 21 is connected to the host device 4 via a bus so as to manage communication between the memory controller 2 and the host device 4. The memory interface circuit 25 is connected to the semiconductor memory device 1 via a memory bus so as to manage communication between the memory controller 2 and the semiconductor memory device 1. The memory bus transmits, for example, a chip enable signal CEn, a command latch enable signal CLE, an address latch enable signal ALE, a write enable signal WEn, a read enable signal REn, a write protect signal WPn, a ready/busy signal R/Bn, and a signal DQ.

(2) Configuration of Semiconductor Memory Device

Figure 2:
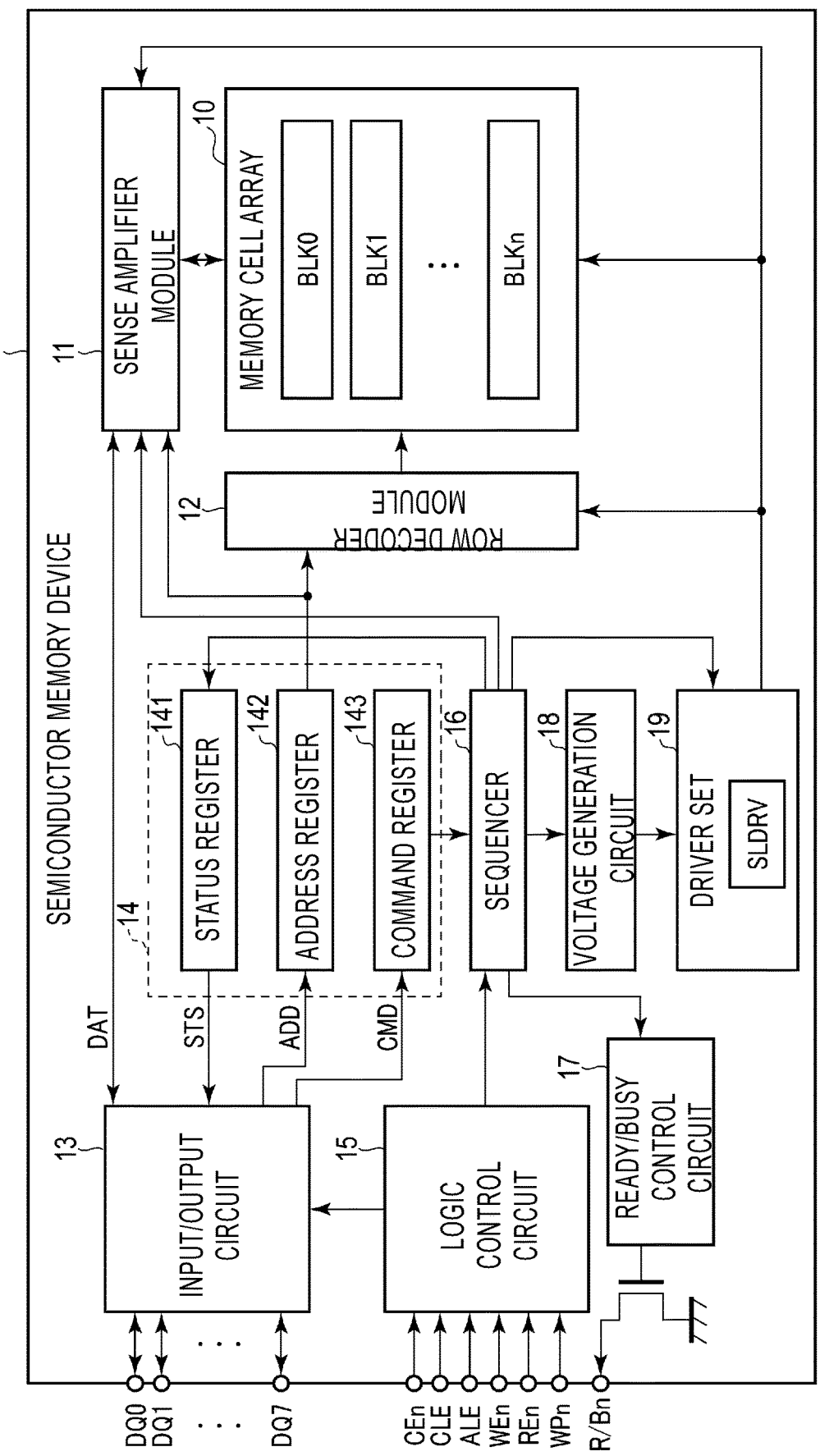
FIG. 2 is a block diagram illustrating an example of the configuration of the semiconductor memory device according to the first embodiment.

FIG. 2 is a block diagram illustrating an example of the configuration of the semiconductor memory device 1 according to the first embodiment. The semiconductor memory device 1 according to the first embodiment is, for example, a NAND-type flash memory capable of storing data in a non-volatile manner.

As illustrated in FIG. 2, the semiconductor memory device 1 includes a memory cell array 10, a sense amplifier module 11, a row decoder module 12, an input/output circuit 13, a register 14, a logic control circuit 15, a sequencer 16, and a ready/busy control circuit 17, a voltage generation circuit 18, and a driver set 19. In the semiconductor memory device 1, various operations such as a write operation of storing write data DAT in the memory cell array 10 and a read operation of reading read data DAT from the memory cell array 10 are performed.

The memory cell array 10 includes blocks BLK0 to BLKn (the symbol "n" represents an integer greater than or equal to of 1). The block BLK includes plural nonvolatile memory cells associated with bit lines and word lines, and is, for example, a unit of data erasure. In the semiconductor memory device 1, for example, a single-level cell (SLC) method of programming or a multi-level cell (MLC) method of programming may be applied. In the SLC method, 1-bit data is stored in each memory cell, and in the MLC method, 2 bit data is stored in each memory cell.

The input/output circuit 13 controls the input/output of the signal DQ with the memory controller 2. The signal DQ includes, for example, a command CMD, data DAT, address information ADD, and status information STS. The command CMD includes, for example, an instruction for executing an instruction from the host device 4. The data DAT includes the write data DAT or the read data DAT. The address information ADD includes, for example, a column address and a row address. The status information STS includes, for example, information on the status of the semiconductor memory device 1 related to the write operation and the read operation.

More specifically, the input/output circuit 13 includes an input circuit and an output circuit, and the input circuit and the output circuit perform the following processes. The input circuit receives the write data DAT, the address information ADD, and the command CMD from the memory controller 2. The input circuit transfers the received write data DAT to the sense amplifier module 11 and transfers the received address information ADD and command CMD to the register 14. Meanwhile, the output circuit receives the status information STS from the register 14 and receives the read data DAT from the sense amplifier module 11. The output circuit transmits the received status information STS and read data DAT to the memory controller 2.

The register 14 includes a status register 141, an address register 142, and a command register 143.

The status register 141 stores the status information STS, and transfers the status information STS to the input/output circuit 13 based on an instruction of the sequencer 16.

The address register 142 stores the address information ADD transferred from the input/output circuit 13. The address register 142 transfers the column address in the address information ADD to the sense amplifier module 11, and transfers the row address in the address information ADD to the row decoder module 12.

The command register 143 stores the command CMD transferred from the input/output circuit 13 and transfers the command CMD to the sequencer 16.

The logic control circuit 15 receives, for example, the chip enable signal CEn, the command latch enable signal CLE, the address latch enable signal ALE, the write enable signal WEn, the read enable signal REn, and the write protect signal WPn from the memory controller 2. The logic control circuit 15 controls the input/output circuit 13 and the sequencer 16 based on the received signals.

The chip enable signal CEn is a signal used to enable the semiconductor memory device 1. The command latch enable signal CLE is a signal used to notify the input/output circuit 13 that the signal DQ input to the semiconductor memory device 1 is the command CMD. The address latch enable signal ALE is a signal used to notify the input/output circuit 13 that the signal DQ input to the semiconductor memory device 1 is the address information ADD. The write enable signal WEn and the read enable signal REn are, for example, signals used to indicate to the input/output circuit 13 that the signal DQ is an input signal supplied thereto or an output signal supplied therefrom. The write protect signal WPn is a signal used to instruct the semiconductor memory device 1 to prohibit writing and erasing of data.

The sequencer 16 controls the entire operation of the semiconductor memory device 1 based on the command CMD stored in the command register 143. For example, the sequencer 16 controls the sense amplifier module 11, the row decoder module 12, the voltage generation circuit 18, the driver set 19, and the like so as to execute various operations such as a write operation and a read operation.

The ready/busy control circuit 17 generates the ready/busy signal R/Bn according to the control by the sequencer 16, and transmits the generated ready/busy signal R/Bn to the memory controller 2. The ready/busy signal R/Bn is a signal used to notify whether the semiconductor memory device 1 is in a ready state in which state an instruction from the memory controller 2 can be received or in a busy state in which state an instruction from the memory controller 2 cannot be received.

The voltage generation circuit 18 generates voltages used for a write operation, a read operation, and the like based on the control by the sequencer 16, and supplies the generated voltages to the driver set 19.

The driver set 19 includes a driver SLDRV. The driver set 19 generates various voltages to be applied to a word line WL, a source line SL, and the like (to be described later) during various operations such as, for example, a read operation and a write operation using the voltages supplied from the voltage generation circuit 18. The driver set 19 transfers the generated voltages to the sense amplifier module 11 and the row decoder module 12. The driver SLDRV transfers the generated voltages to the source line SL.

The sense amplifier module 11 receives a column address from the address register 142 and decodes the received column address. The sense amplifier module 11 performs an operation of transferring the data DAT between the memory controller 2 and the memory cell array 10 as described below based on the result of the decoding. That is, the sense amplifier module 11 senses the data read from the memory cell array 10 to generate read data DAT, and outputs the generated read data DAT to the memory controller 2 via the input/output circuit 13. The sense amplifier module 11 also receives the write data DAT from the memory controller 2 via the input/output circuit 13 and transfers the received write data DAT to the memory cell array 10.

The row decoder module 12 receives a row address from the address register 142 and decodes the received row address. The row decoder module 12 selects a block BLK of a target on which various operations such as a read operation and a write operation are to be performed based on the result of the decoding. The row decoder module 12 may transfer the voltage supplied from the driver set 19 to the selected block BLK.

(3) Memory Cell Array of NAND-Type Flash Memory

Figure 3:
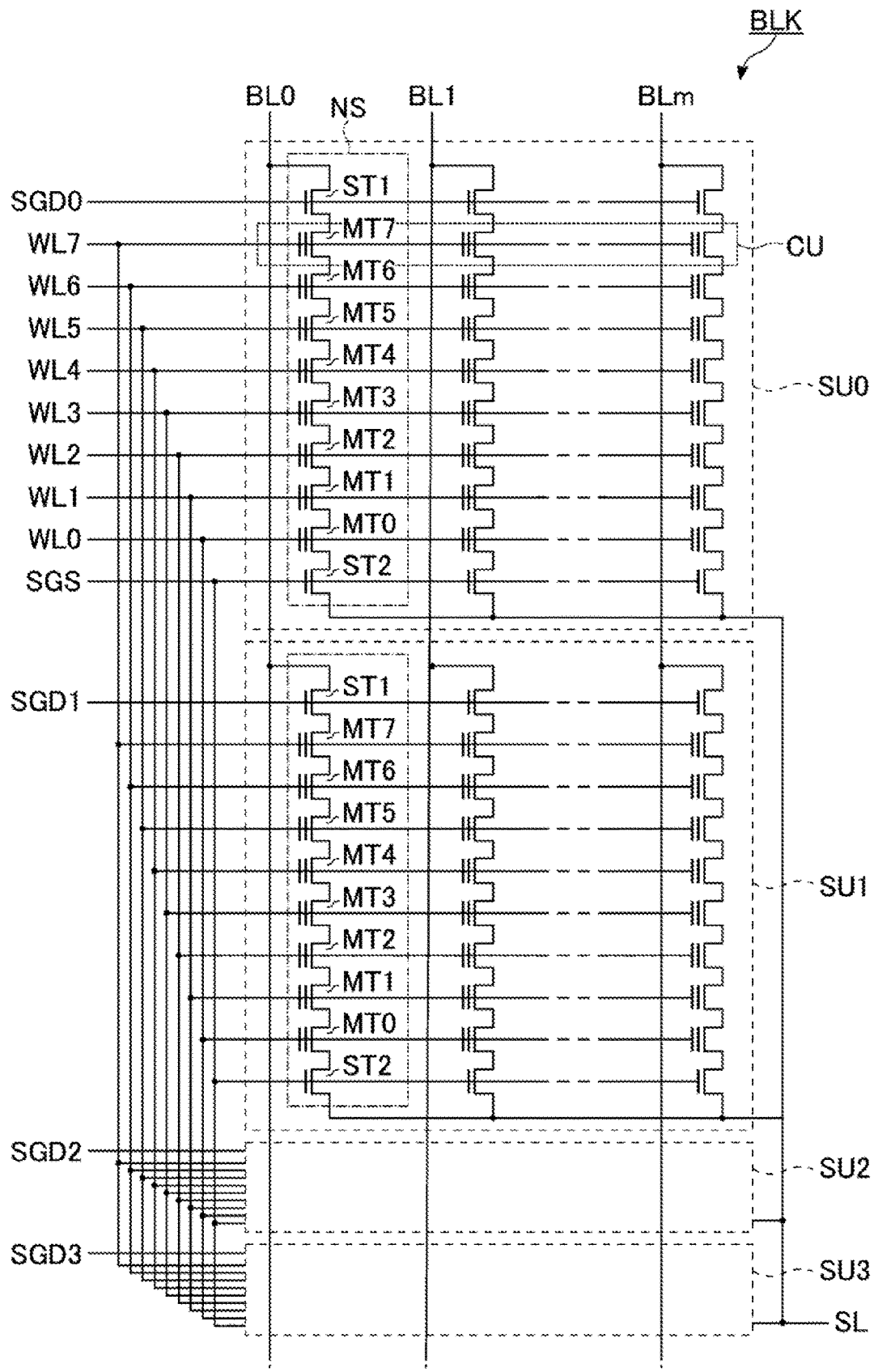
FIG. 3 is a diagram illustrating an example of a circuit configuration of a memory cell array in the semiconductor memory device according to the first embodiment.

FIG. 3 is a diagram illustrating an example of the circuit configuration of one block BLK among the plural blocks BLK in the memory cell array 10 as an example of the circuit configuration of the memory cell array 10 illustrated in FIG. 2. For example, each of the plural blocks BLK in the memory cell array 10 has the circuit configuration illustrated in FIG. 3.

As illustrated in FIG. 3, the block BLK includes, for example, four string units SU0 to SU3. Each of the string units SU includes plural NAND strings NS. Each of the plural NAND strings NS is associated with a bit line BL among bit lines BL0 to BLm (the symbol "m" represents an integer greater than or equal to 1), and includes, for example, memory cell transistors MT0 to MT7 and select transistors ST1 and ST2. The memory cell transistor MT includes a control gate and a charge storage layer, and stores data in a non-volatile manner. Each of the select transistors ST1 and ST2 is used to select a NAND string NS including the select transistors ST1 and ST2 during various operations.

In each of the plural NAND strings NS, the drain of the select transistor ST1 is connected to the corresponding bit line BL. The memory cell transistors MT0 to MT7 are connected in series between the source of the select transistor ST1 and the drain of the select transistor ST2. The source of the select transistor ST2 is connected to the source line SL.

Across the plural NAND strings NS in the same block BLK, the control gates of the memory cell transistors MT0 to MT7 in each NAND string NS are commonly connected to the corresponding word line WL among the word lines WL0 to WL7. The gates of the select transistors ST1 of the plural NAND strings NS in each of the string units SU0 to SU3 are commonly connected to the select gate lines SGD0 to SGD3 corresponding to the respective string units SU. The gates of the select transistors ST2 in each NAND string NS are commonly connected to a select gate line SGS across the plural NAND strings NS in the same block BLK.

Each bit line BL is commonly connected to the drain of the select transistor ST1 of the corresponding NAND string NS across the plural string units SU. The source line SL is shared among the plural string units SU.

A set of the memory cell transistors MT connected to a common word line WL in one string unit SU is referred to as, for example, a cell unit CU. For example, when each of the memory cell transistors MT in the cell unit CU stores 1-bit data, data corresponding to the storage capacity of the cell unit CU is referred to as, for example, "1 page data."

While the circuit configuration of the memory cell array 10 has been described above, the circuit configuration of the memory cell array 10 is not limited to that described above. For example, each block BLK may have any number of string units SU. In addition, each NAND string NS may have any number of memory cell transistors MT and select transistors ST1 and ST2. The numbers of the word lines WL and the select gate lines SGD and SGS are changed based on the numbers of the memory cell transistors MT and the select transistors ST1 and ST2 in the NAND strings NS.

(4) Threshold Voltage Distribution of Memory Cell Transistor

Figure 4:
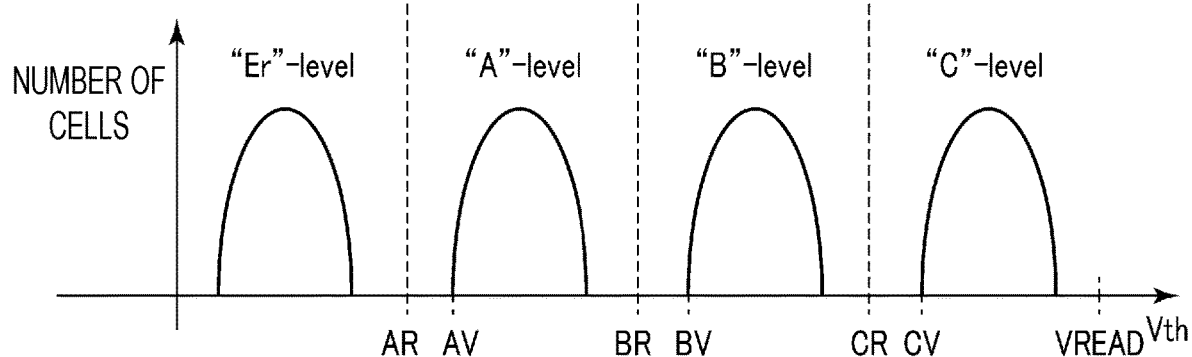
FIG. 4 is a diagram illustrating an example of a threshold voltage distribution of memory cell transistors in the semiconductor memory device according to the first embodiment.

FIG. 4 is a diagram illustrating examples of a threshold voltage distribution, a data allocation, a read voltage, and a verify voltage when the memory cell transistors MT in the memory cell array 10 illustrated in FIG. 1 store 2-bit data.

The memory cell transistor MT stores the 2-bit data based on a voltage difference between a gate and a source which enables the memory cell transistor MT to be turned on (hereinafter, referred to as a threshold voltage). In the write operation, a control of the threshold voltage of the memory cell transistor MT is performed. FIG. 4 illustrates four threshold voltage distributions which are a result of such a control of the threshold voltage. In the threshold voltage distribution illustrated in FIG. 4, the vertical axis corresponds to the number of the memory cell transistors MT, and the horizontal axis corresponds to the threshold voltage Vth of the memory cell transistors MT. For example, when a voltage VSRC is applied to the source of the memory cell transistor MT, a voltage applied to the gate of the memory cell transistor MT to turn on the memory cell transistor MT is illustrated on the horizontal axis.

For example, the four threshold voltage distributions are distinguished as being in the "Er" state, the "A" state, the "B" state, and the "C" state in order from those located in the region where the threshold voltage is the lowest. For example, "11" ("lower bit/upper bit") data is allocated to the "Er" state, "10" data is allocated to the "A" state, "000" data is allocated to the "B" state, and "01" data is allocated to the "C" state. The data allocated to the threshold voltage distribution of each state is data that is stored in the memory cell transistor MT whose threshold voltage distribution includes the threshold voltage.

Verify voltages used in the write operation are set between adjacent threshold voltage distributions. Specifically, a verify voltage AV is set to correspond to the "A" state, a verify voltage BV is set to correspond to the "B" state, and a verify voltage CV is set to correspond to the "C" state. The verify voltage is a voltage used in a verify operation to confirm whether a target level of the memory cell transistor MT has been reached.

More specifically, the verify voltage AV is set between the maximum threshold voltage at the "Er" state and the minimum threshold voltage at the "A" state. When the verify voltage AV is applied to the memory cell transistor MT, the memory cell transistor MT whose threshold voltage falls within the threshold voltage distribution at the "Er" state is turned on, while the memory cell transistor MT whose threshold voltage falls within the threshold voltage distribution at the "A" state or higher is turned off. For example, as a result of the write operation of the "10" data, it becomes possible to confirm whether the threshold voltage of the memory cell transistor MT falls within the threshold voltage distribution at the "A" state.

The other verify voltages BV and CV are also set similarly to the verify voltage AV. The verify voltage BV is set between the maximum threshold voltage at the "A" state and the minimum threshold voltage at the "B" state, and the verify voltage CV is set between the maximum threshold voltage at the "B" state and the minimum threshold voltage at the "C" state.

Further, read voltages used in the read operations are set between adjacent threshold voltage distributions. Specifically, a read voltage AR is set to correspond to the "A" state, a read voltage BR is set corresponding to the "B" state, and a read voltage CR is set to correspond to the "C" state. The read voltage is a voltage used in a read operation of confirming the state of threshold voltage distribution within which the threshold voltage of the memory cell transistor MT falls.

More specifically, the read voltage AR is set between the maximum threshold voltage at the "Er" state and the minimum threshold voltage at the "A" state, similarly to the verify voltage AV. When the read voltage AR is applied to the memory cell transistor MT, the memory cell transistor MT whose threshold voltage falls within the threshold voltage distribution at the "Er" state is turned on, while the memory cell transistor MT whose threshold voltage falls within the threshold voltage distribution at the "A" state or higher is turned off. As a result, it becomes possible to determine whether the threshold voltage of the memory cell transistor MT falls within the threshold voltage distribution at the "Er" state or in the threshold voltage distribution at the "A" state or higher.

The other read voltages BR and CR are also set similarly to the read voltage AR. The read voltage BR is set between the maximum threshold voltage at the "A" state and the minimum threshold voltage at the "B" state, and the read voltage CR is set between the maximum threshold voltage at the "B" state and the minimum threshold voltage at the "C" state.

Further, the following magnitude relationship exists between the verify voltage and the read voltage described above. That is, the verify voltage AV is set to a voltage higher than the read voltage AR, the verify voltage BV is set to a voltage higher than the read voltage BR, and the verify voltage CV is set to a voltage higher than the read voltage CR. For example, it is configured such that the verify voltage AV is set near the lower portion of the threshold voltage distribution at the "A" state, the verify voltage BV is set near the lower portion of the threshold voltage distribution at the "B" state, and the verify voltage CV is set near the lower portion of the threshold voltage distribution at the "C" state.

In addition, a read pass voltage VREAD is set to a voltage higher than the maximum threshold voltage among the threshold voltage distributions located in the region where the threshold voltage is the highest. The memory cell transistor MT in which the read pass voltage VREAD is applied to the gate is turned on regardless of the stored data.

In addition, the number of bits of data stored in one memory cell transistor MT described above and the allocation of data to the above threshold voltage distribution are merely examples, and the present disclosure is not limited thereto. For example, data of 1 bit or 3 bits or more may be stored in one memory cell transistor MT.

(5) Circuit Configuration of Sense Amplifier Module

Figure 5:
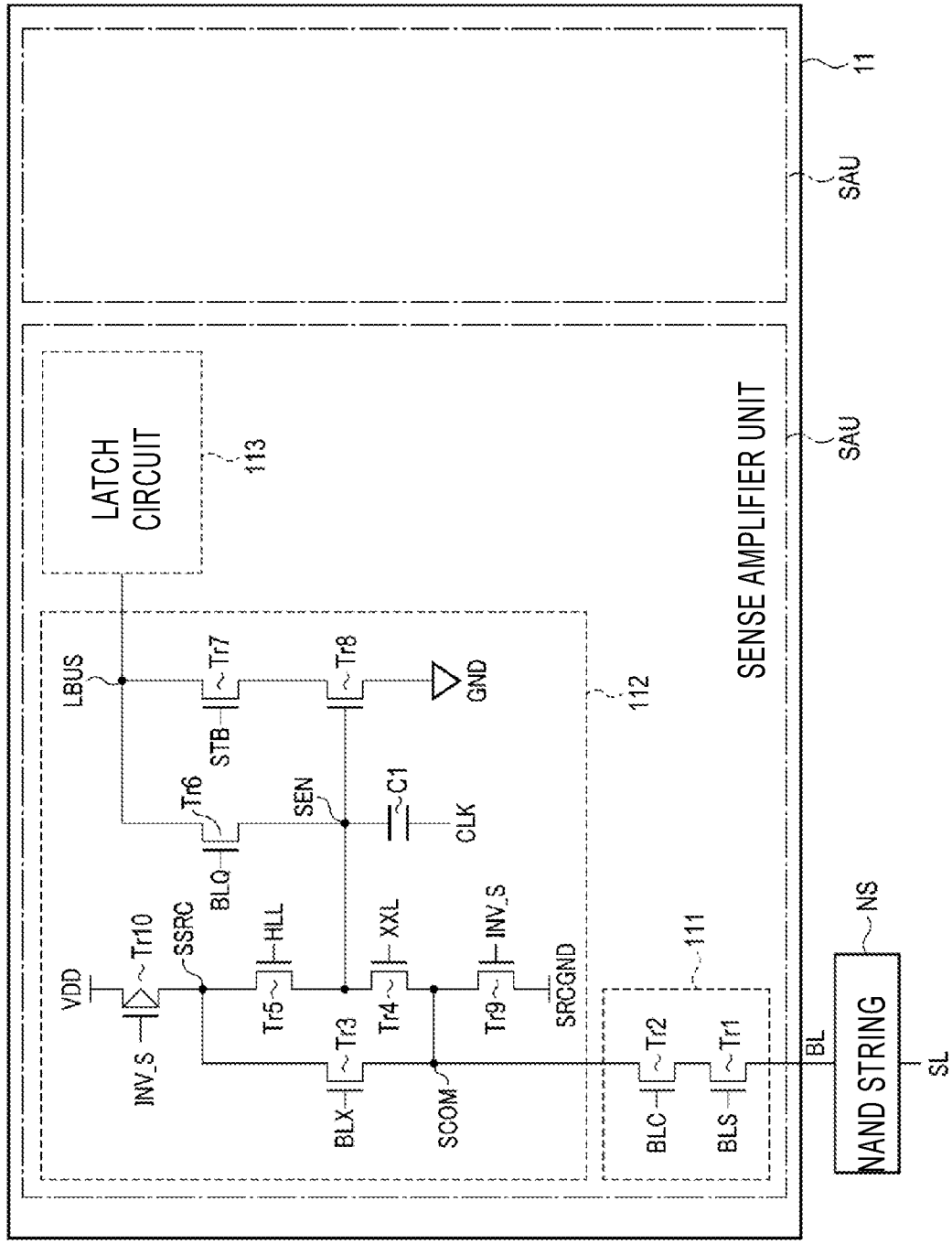
FIG. 5 is a diagram illustrating an example of a part of a circuit configuration of a sense amplifier module in the semiconductor memory device according to the first embodiment.

FIG. 5 is a diagram illustrating an example of a part of the circuit configuration of the sense amplifier module 11 illustrated in FIG. 2. In the following description, the memory cell transistor MT to be written or read is referred to as a selected memory cell transistor MT.

The sense amplifier module 11 includes, for example, a sense amplifier unit SAU provided for each bit line. As illustrated in FIG. 5, one sense amplifier unit SAU includes a connection portion 111, a sensing unit 112, and a latch circuit 113. When each memory cell transistor MT holds 2 or more bits of data, two (2) or more latch circuits are provided based on the number of bits.

The connection unit 111 connects the corresponding bit line BL to the sensing unit 112. Specifically, the connection unit 111 includes n channel MOS transistors Tr1 and Tr2. A first terminal of the transistor Tr1 is connected to the corresponding bit line BL, and a second terminal of the transistor Tr1 is connected to a first terminal of the transistor Tr2. A control signal BLS is applied to the gate of the transistor Tr1. The second terminal of the transistor Tr2 is connected to a node SCOM, and a control signal BLC is applied to the gate of the transistor Tr2. The corresponding bit line BL may be clamped to the voltage according to the control signal BLC by the transistor Tr2.

The sensing unit 112 senses the data read based on the voltage of the bit line BL. The sensing unit 112 includes n channel MOS transistors Tr3, Tr4, Tr5, Tr6, Tr7, Tr8, and Tr9, a p channel MOS transistor Tr10, and a capacitive element C1.

The first terminal of the transistor Tr3 is connected to the node SCOM, and the second terminal of the transistor Tr3 is connected to a node SSRC. A control signal BLX is applied to the gate of the transistor Tr3. The first terminal of the transistor Tr10 is connected to the node SSRC, and a voltage VDD is applied to the second terminal of the transistor Tr10. The gate of the transistor Tr10 is connected to a node INV_S. The first terminal of the transistor Tr5 is connected to the node SSRC, and the second terminal of the transistor Tr5 is connected to a node SEN. A control signal HLL is applied to the gate of the transistor Tr5. A first electrode of the capacitive element C1 is connected to the node SEN, and a signal CLK is supplied to a second electrode of the capacitive element C1. The first terminal of the transistor Tr4 is connected to the node SEN, and the second terminal of the transistor Tr4 is connected to the node SCOM. A control signal XXL is applied to the gate of the transistor Tr4. The first terminal of the transistor Tr9 is connected to the node SCOM, the second terminal of the transistor Tr9 is connected to a node SRCGND, and the gate of the transistor Tr9 is connected to the node INV_S. The voltage applied to the node SRCGND is, for example, VSS. VSS is, for example, 0V.

The transistor Tr10 and the transistor Tr3 enable the bit line BL to be precharged. The capacitive element C1 is charged during precharging of the bit line BL. The transistor Tr10 and the transistor Tr5 enable the capacitive element C1 to be charged. The transistor Tr4 enables the node SEN to be discharged during data sensing. The transistor Tr9 enables the bit line BL to be fixed at a constant voltage.

The first terminal of the transistor Tr6 is connected to the node SEN, and the second terminal of the transistor Tr6 is connected to a node LBUS. A control signal BLQ is applied to the gate of the transistor Tr6. The node LBUS is a signal path that connects the sensing unit 112 and the latch circuit 113. The first terminal of the transistor Tr7 is connected to the node LBUS, and the second terminal of the transistor Tr7 is connected to the first terminal of the transistor Tr8. A control signal STB is applied to the gate of the transistor Tr7. The second terminal of the transistor Tr8 is grounded, and the gate of the transistor Tr8 is connected to the node SEN.

The transistor Tr7 enables control of data sense timing and storage of read data in the latch circuit 113. The transistor Tr8 enables sensing whether the read data is "0" or "1" based on the voltage of the node SEN.

The node INV_S is a node in the latch circuit 113, and may take a logic level according to the data stored in the latch circuit 113. For example, when the selected memory cell transistor MT is turned on at the time of data reading and the voltage of the node SEN is sufficiently lowered, the node INV_S is at the H level. Meanwhile, when the selected memory cell transistor MT is in the off state and the node SEN has a constant voltage, the node INV_S is at the L level.

In the above-described configuration, at the timing when the control signal STB is asserted, read data based on the voltage of the node SEN is transferred to the latch circuit 113 by the transistor Tr7. The control signals STB, BLS, BLC, BLX, HLL, XXL, and BLQ are supplied by, for example, the sequencer 16.

The configuration of the sense amplifier module 11 described in detail above is merely an example, and various other configurations may be used as the sense amplifier module 11.

Operation Example (1) Outline of Write Operation and Read Operation

The semiconductor memory device 1 according to the first embodiment repeatedly executes a program loop during the write operation. The program loop includes a program operation and a verify operation. The program operation is an operation of raising the threshold voltage of the selected memory cell transistor MT by injecting electrons into the charge storage layer in the selected memory cell transistor MT (or maintaining the threshold voltage of the selected memory cell transistor MT by inhibiting the injection of electrons into the charge storage layer). The verify operation is an operation of confirming whether the threshold voltage of the selected memory cell transistor MT has reached the target state by performing a read operation using a verify voltage following the program operation.

The selected memory cell transistor MT whose threshold voltage has reached the target state is thereafter write-inhibited.

The threshold voltage of the selected memory cell transistor MT is raised to the target state by repeatedly executing the program loop including the program operation and the verify operation described above.

Electrons stored in the charge storage layer may be stored in an unstable state. Therefore, electrons stored in the charge storage layer of the memory cell transistor MT may escape from the charge storage layer as time elapses from the end of the program operation. When the electrons escape from the charge storage layer, the threshold voltage of the memory cell transistor MT decreases. Therefore, during the read operation performed after the completion of the write operation, the read operation is performed using a read voltage lower than the verify voltage in order to accommodate the decrease in the threshold voltage of the memory cell transistor which may occur with the passage of time.

In the following description, it is assumed that the read operation may include a verify operation.

(2) Examples of Various Voltages Used in Read Operation

Figure 6:
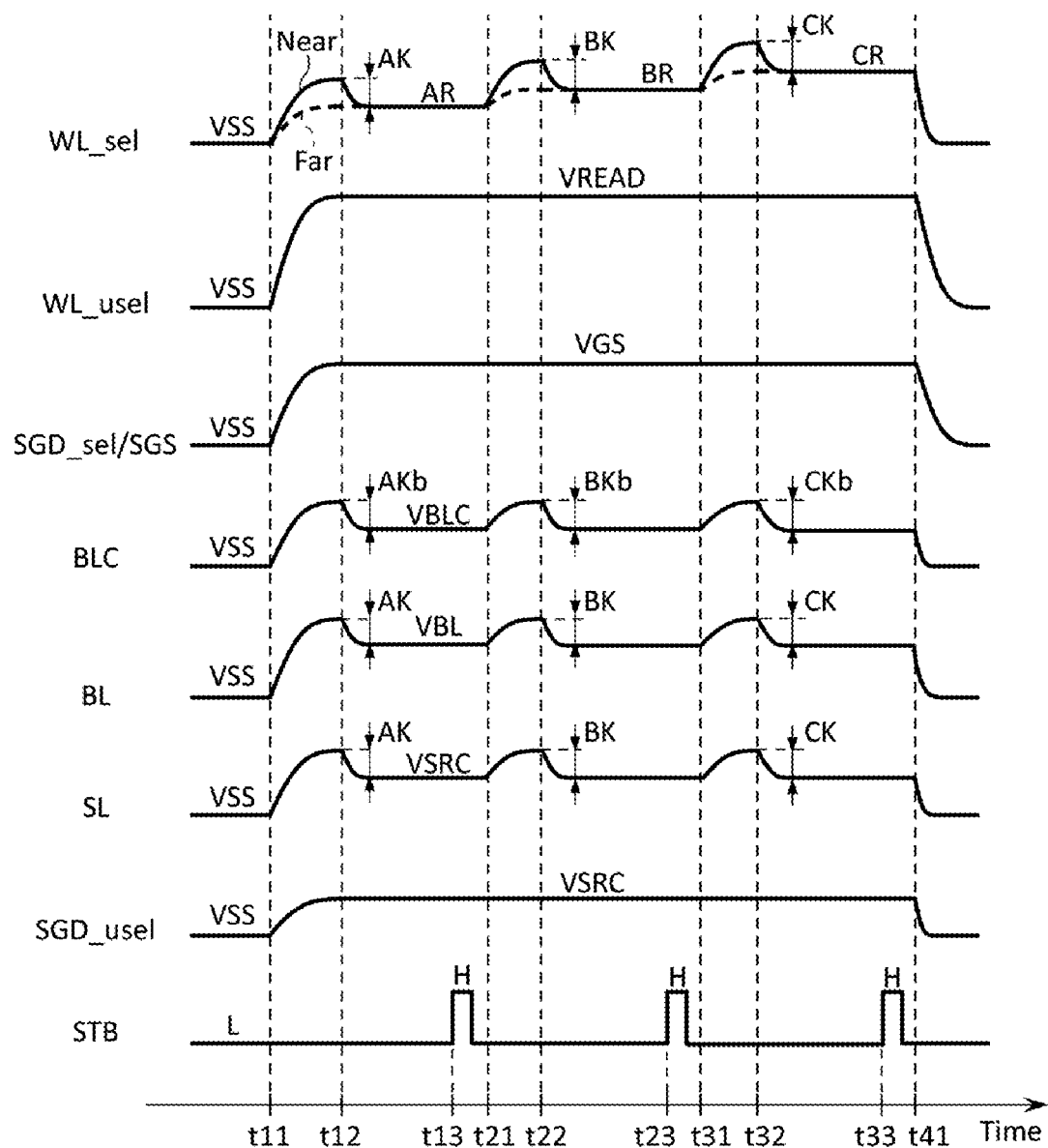
FIG. 6 is a timing chart illustrating an example of changes in voltages that are applied to various circuit elements during a read operation in the semiconductor memory device according to the first embodiment.

FIG. 6 is a timing chart illustrating an example of changes in voltages that are applied to various circuit elements during a read operation in the semiconductor memory device 1 according to the first embodiment. Further, the timing chart illustrated in FIG. 6 only schematically illustrates the voltages applied to the various circuit elements, and does not necessarily illustrate, for example, the change in the voltage of the bit line BL, etc. when the bit line BL is discharged. FIG. 6 illustrates a case where a read using the read voltage AR, a read using the read voltage BR, and a read using the read voltage CR are continuously performed during the read operation. Further, the same process as described below may be applied to the read operation using the verify voltage.

In the following description, the word line connected to the selected memory cell transistor MT is referred to as a selected word line WL_sel, and the word line not connected to the selected memory cell transistor MT is referred to as a non-selected word line WL_usel. Further, among the select gate lines SGD, the select gate line SGD of the selected string unit SU is referred to as a selected select gate line SGD_sel, and the select gate line of the non-selected string unit SU is referred to as a non-selected select gate line SGD_usel.

As described above, application of voltages to the word lines WL_sel and WL_usel and the select gate lines SGD_sel, SGD_usel, and SGS is executed by the control of the voltage generation circuit 18, the driver set 19, and the row decoder module 12 by the sequencer 16. In addition, the application of voltages to the source line SL is executed by the control of the voltage generation circuit 18 and the driver SLDRV in the driver set 19 by the sequencer 16. Further, the application of voltages to the bit line BL is executed by the control of the voltage generation circuit 18, the driver set 19, and the sense amplifier module 11 by the sequencer 16. In addition, the control signals BLC and STB are supplied by the sequencer 16.

In the example illustrated in FIG. 6, the voltages applied to the word lines WL_sel and WL_usel, the select gate lines SGD_sel, SGD_usel, and SGS, the bit line BL, and the source line SL, respectively, at the start of the read operation are VSS. Further, the voltage of the control signal BLC is VSS, and the voltage of the control signal STB is at the low (L) level.

Here, when a voltage is applied to the word lines WL, for example, due to an RC delay, the time until the voltage of a portion among the word lines WL that is physically close to, for example, the position where the voltage is applied is stabilized may be relatively short, and the time until the voltage of a portion among the word lines WL that is physically distant from, for example, the position where the voltage is applied may be relatively long. Hereinafter, such a portion of the word line WL where the time until the voltage thereof is stabilized is relatively short is described as being on a "near end side of the word line WL," and a portion of the word line WL where the time until the voltage thereof is stabilized is relatively long is described as being on a "far end side of the word line WL."

In the present embodiment, in the read operation, a kick operation is performed on the selected word line WL_sel.

The kick operation refers to an operation of causing a voltage greater than a target voltage to be applied for a certain period of time. It is possible to shorten the time until the voltage of the far end side portion of the selected word line WL_sel is stabilized by the target voltage by performing the kick operation on the selected word line WL_sel. Here, in the following description, a voltage greater than the target voltage is referred to as a kick voltage, and a difference between the kick voltage and the target voltage is referred to as a kick amount.

First, as described below, a read operation using the read voltage AR is performed.

At time t11, a voltage obtained by adding a kick amount AK to the read voltage AR, which is the target voltage, is applied to the selected word line WL_sel, and the voltage VREAD is applied to the word line WL_usel. Thereafter, the read voltage AR is applied to the selected word line WL_sel at time t12. Thus, the kick operation is performed on the selected word line WL_sel. By the kick operation, as illustrated in FIG. 6, the voltage at the near end side portion of the selected word line WL_sel (indicated by a solid line with the term "Near" in the figure) may become higher than the voltage which is stabilized by the read voltage AR before it is stabilized by the read voltage AR.

Meanwhile, at time t11, a voltage obtained by adding the kick amount AK to a voltage VSRC, which is the target voltage, is applied to the source line SL. Thereafter, the voltage VSRC is applied to the source line SL at time t12.

Further, at time t11, the voltage VGS is applied to the select gate lines SGD_sel and SGS, and the voltage VSRC is applied to the select gate line SGD_usel.

In addition, charging of the bit line BL is started at time t11. During the charging, at time t11, the control signal BLC is changed to a voltage obtained by adding a kick amount AKb to a voltage VBLC which is a target voltage, and as a result, a voltage obtained by adding the kick amount AKb to the voltage VBL which is the target voltage is applied to the bit line BL. Thereafter, at time t12, the control signal BLC is changed to the voltage VBLC, and as a result, the voltage VBL is applied to the bit line BL.

Thus, the kick operation is also performed on the source line SL and the bit line BL according to the kick operation on the selected word line WL_sel.

Time t12 corresponds to, for example, the time at which the voltage of the far end side portion of the selected word line WL_sel (indicated by the term "Far") is stabilized. That is, based on the time required to increase the voltage of the far end side portion of the selected word line WL_sel, the time t12 may be set by the voltage obtained by adding the kick amount AK to the read voltage AR as the time when the voltage of the far end side portion of the selected word line WL_sel reaches the voltage stabilized by the read voltage AR, which is the target voltage, or as the time before and after that time. The same applies to the following times t22 and t32.

After the voltages of the word lines WL_sel and WL_usel, the select gate lines SGD_sel, SGD_usel, and SGS, the bit line BL, and the source line SL are stabilized, the control signal STB becomes a high level to be asserted at time t13. As a result, the read data based on the read voltage AR is transferred to the latch circuit in the sense amplifier module 11.

Next, as described below, a read operation using the read voltage BR is continuously performed.

Also, in a read operation using the read voltage BR following the read operation using the read voltage AR, a kick operation is performed on the selected word line WL_sel, and accordingly, an operation according to the kick operation is performed on the source line SL and the bit line BL. Further, in such an operation performed according to the kick operation, unlike the kick operation described above, the voltage of the source line SL or the bit line BL does not necessarily rise before and after the operation. However, in the following description, such an operation will also be described as a kick operation, and as in the kick operation described above, descriptions will be made by referring to a voltage which is greater than the target voltage applied before the target voltage is applied as a kick voltage, and referring to a difference in magnitude between the kick voltage and the target voltage as a kick amount.

At time t21, a voltage obtained by adding a kick amount BK to the read voltage BR, which is the target voltage, is applied to the selected word line WL_sel. Thereafter, at time t22, the read voltage BR is applied to the selected word line WL_sel. Thus, the kick operation is performed on the selected word line WL_sel. By the kick operation, as illustrated in FIG. 6, the voltage at the near end side portion of the selected word line WL_sel may become higher than the voltage which is stabilized by the read voltage BR before it is stabilized by the read voltage BR.

Meanwhile, at time t21, a voltage obtained by adding the kick amount BK to the voltage VSRC, which is the target voltage, is applied to the source line SL. Thereafter, the voltage VSRC is applied to the source line SL again at time t22.

Further, at time t21, the control signal BLC is changed to a voltage obtained by adding a kick amount BKb to the voltage VBLC which is the target voltage, whereby a voltage obtained by adding the kick amount BK to the voltage VBL, which is the target voltage, is applied to the bit line BL. Thereafter, at time t22, the control signal BLC is changed to the voltage VBLC, whereby the voltage VBL is applied to the bit line BL again.

As described above, also, in the read operation using the read voltage BR, the kick operation is performed on the source line SL and the bit line BL according to the kick operation on the selected word line WL_sel.

After the voltages of the selected word line WL_sel, the bit line BL, and the source line SL are stabilized, the control signal STB becomes a high level to be asserted at time t23. As a result, read data based on the read voltage BR is transferred to the latch circuit in the sense amplifier module 11.

Next, as described below, similarly to the read operation using the read voltage BR, the read operation using the read voltage CR is continuously performed.

At time t31, a voltage obtained by adding a kick amount CK to the read voltage CR, which is the target voltage, is applied to the selected word line WL_sel. Thereafter, the read voltage CR is applied to the selected word line WL_sel at time t32. Thus, the kick operation is performed on the selected word line WL_sel. By the kick operation, as illustrated in FIG. 6, the voltage at the near end side portion of the selected word line WL_sel may become higher than the voltage which is stabilized by the read voltage CR before it is stabilized by the read voltage CR.

Meanwhile, at time t31, a voltage obtained by adding the kick amount CK to the voltage VSRC, which is the target voltage, is applied to the source line SL. Thereafter, at time t32, the voltage VSRC is applied to the source line SL again.

Further, at time t31, the control signal BLC is changed to a voltage obtained by adding a kick amount CKb to the voltage VBLC which is the target voltage, whereby a voltage obtained by adding the kick amount CK to the voltage VBL, which is the target voltage, is applied to the bit line BL. Thereafter, at time t32, the control signal BLC is changed to the voltage VBLC, whereby the voltage VBL is applied to the bit line BL again.

As described above, also, in the read operation using the read voltage CR, the kick operation is performed on the source line SL and the bit line BL according to the kick operation on the selected word line WL_sel.

After the voltages of the selected word line WL_sel, the bit line BL, and the source line SL are stabilized, the control signal STB becomes a high level to be asserted at time t33. As a result, read data based on the read voltage CR is transferred to the latch circuit in the sense amplifier module 11.

Further, descriptions have been made above on a case where the kick operation is performed according to the kick operation on the selected word line WL_sel with respect to the bit line BL. Alternatively, for example, when the voltage VBL is set to a voltage always greater than the voltage applied to the source line SL, the kick operation may not necessarily be performed on the bit line BL.

Further, descriptions have been made above on a case where the read operation is continuously performed in the order of the read operation using the read voltage AR, the read operation using the read voltage BR, and the read operation using the read voltage CR. However, the read operation is not limited thereto.

As described above, the kick operation performed on the source line SL and the bit line BL corresponds to the kick operation performed on the selected word line WL_sel. For example, in the above-described example, the period during which the kick voltage is applied to the selected word line WL_sel and the period during which the kick voltage is applied to the source line SL and the bit line BL are the same period. Further, the kick amount in the kick operation for the selected word line WL_sel matches the kick amount in the kick operation for the source line SL and the bit line BL. However, the kick operation for the source line SL and the bit line BL performed according to the kick operation for the selected word line WL_sel is not limited to this. For example, the kick amount in the kick operation for the selected word line WL_sel, the kick amount in the kick operation for the source line SL, and the kick amount in the kick operation for the bit line BL may not necessarily coincide with each other. Further, the timing at which the kick voltage or the target voltage is applied to each of the selected word line WL_sel, the source line SL, and the bit line BL may not all coincide. For example, the timing at which the kick voltage is applied to the source line SL and the bit line BL may be in accordance with the timing at which the kick voltage is applied to the selected word line WL_sel. Also, for example, the kick operation on the source line SL may be completed at least before the corresponding control signal STB is asserted.

[Effect]

Figure 7:
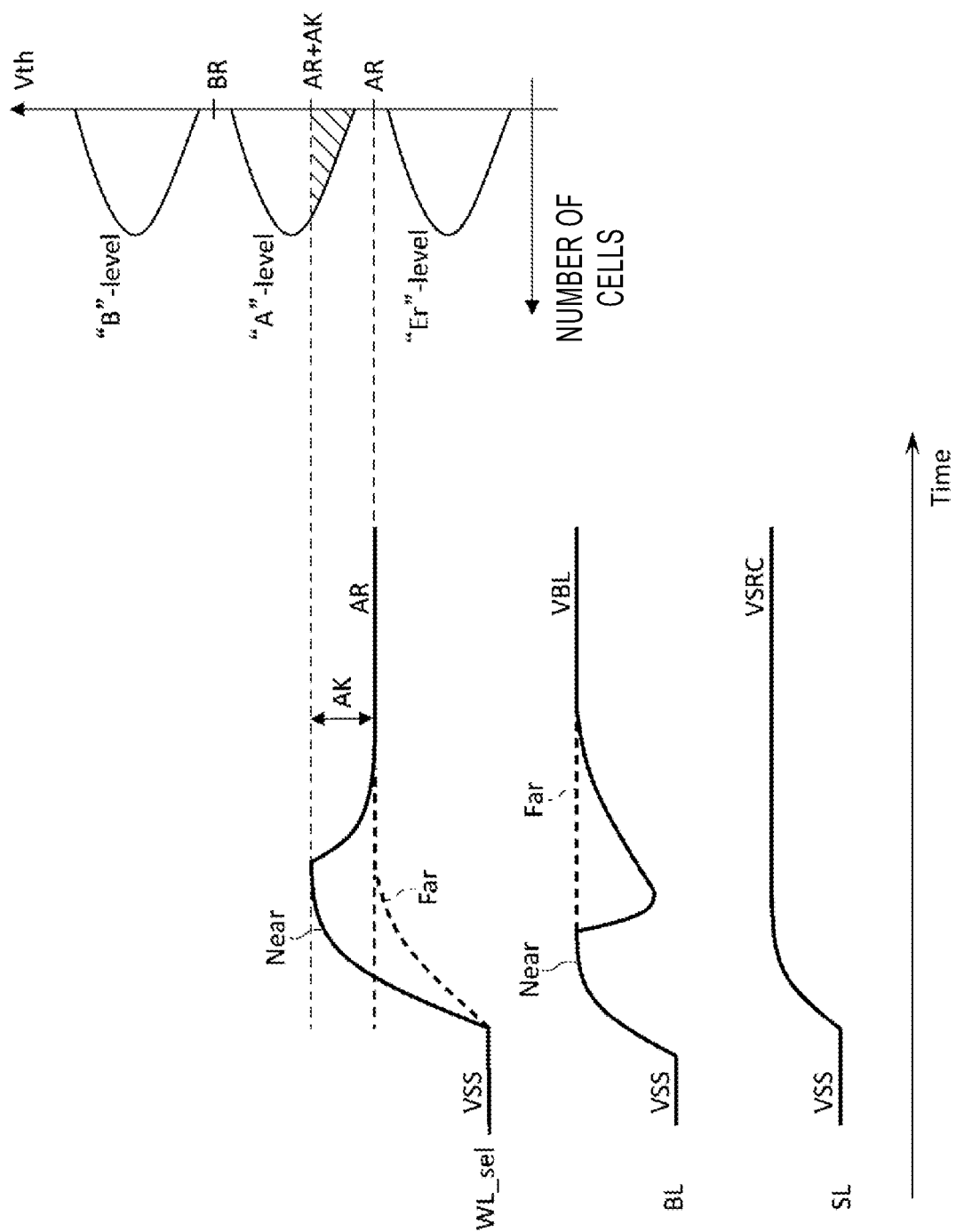
FIG. 7 is a timing chart illustrating an example of changes in voltages that are applied to various circuit elements during a read operation in a semiconductor memory device according to a comparative example.

FIG. 7 is a timing chart illustrating an example of changes in voltages that are applied to various circuit elements during the read operation in the semiconductor memory device according to a comparative example.

Here, for example, during the read operation using the read voltage AR, the read voltage AR is applied to the selected word line WL_sel, and the voltage VSRC is applied to the source line SL. Further, the voltage VBL is applied to the bit line BL so as to charge the bit line BL. After the voltages of the selected word line WL_sel and the source line SL are stabilized by the voltages applied as described above, the selected memory cell transistor MT connected to the selected word line WL_sel is made conductive such that it is determined whether the threshold voltage of the selected memory cell transistor MT falls within the threshold voltage distribution at the "Er" state or in the threshold voltage distribution at the "A" state or higher, based on whether the voltage of the bit line BL is changed.

In the example of FIG. 7, during the read operation using the read voltage AR, the kick operation on the selected word line WL_sel is performed. Execution of the kick operation shortens the time until the voltage at the far end side portion of the selected word line WL_sel is stabilized by the read voltage AR which is the target voltage. Meanwhile, as illustrated in FIG. 7, the voltage at the near end side portion of the selected word line WL_sel may become higher than the voltage which is stabilized by the read voltage AR before it is stabilized by the read voltage AR. Here, in the example of FIG. 7, the voltage VSRC is continuously applied to the source line SL.

In such a case, the voltage difference between the gate and the source of the selected memory cell transistor MT connected to the near end side portion of the selected word line WL_sel may become greater than the voltage of the selected word line WL_sel which is stabilized by the read voltage AR. At this time, even when the selected memory cell transistor MT has a threshold voltage which is not conducted at the read voltage AR, the selected memory cell transistor MT may be conducted (indicated by hatching). When the selected memory cell transistor MT becomes conductive, the bit line BL connected to the selected memory cell transistor MT is discharged, as illustrated in FIG. 7. This discharge does not occur unless there is a kick operation on the selected word line WL_sel, and since the bit line BL needs to be charged with the voltage VBL in order to perform the read operation, it is necessary to charge such a bit line BL again.

In contrast, in the semiconductor memory device 1 according to the first embodiment, the kick operation is also performed on the source line SL during the read operation according to the kick operation on the selected word line WL_sel. For example, when a kick voltage greater than the target voltage is applied for a certain period of time before the target voltage is applied to the selected word line WL_sel, the voltage applied to the source line SL is increased according to the kick amount which is a difference in magnitude between the kick voltage and the target voltage, and the timing at which the kick voltage is applied.

As a result, in the semiconductor memory device 1, the expansion of the voltage difference between the gate and the source of the selected memory cell transistor MT described above can be prevented, and hence the discharge of the bit line BL described above can be prevented. As a result, the time required to charge the bit line BL described above may be shortened, and, for example, the speeding up of the read operation may be achieved in the semiconductor memory device 1.

Second Embodiment

A semiconductor memory device 1a according to a second embodiment will be described below.

Configuration Example

The configuration of the semiconductor memory device 1a according to the second embodiment will be described in detail below with respect to differences from the semiconductor memory device 1 according to the first embodiment.

The semiconductor memory device 1a includes a driver SLDRVa instead of the driver SLDRV in the first embodiment.

(1) Circuit Configuration of Driver SLDRVa

Figure 8:
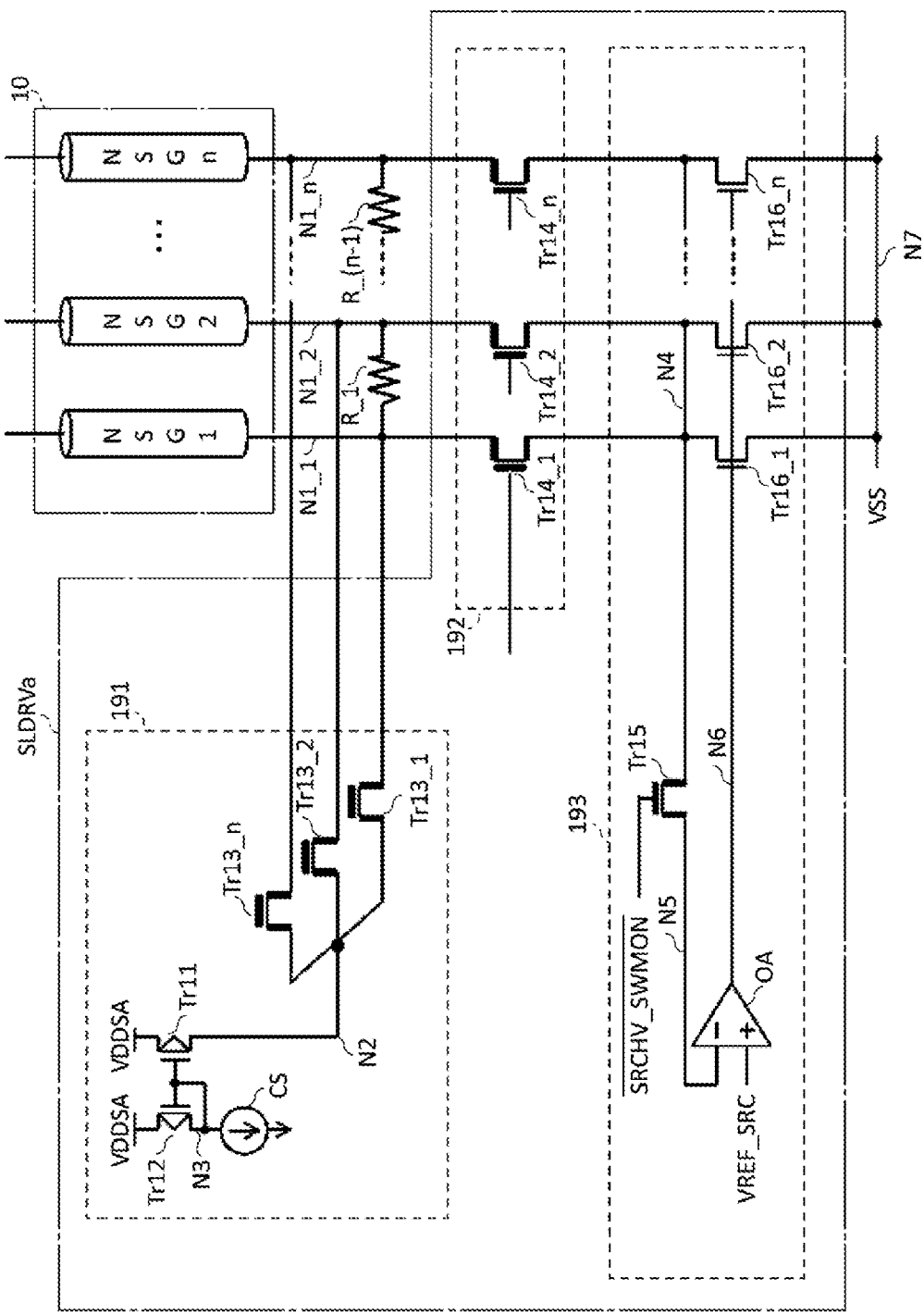
FIG. 8 is a diagram illustrating an example of a circuit configuration of a driver in a semiconductor memory device according to a second embodiment.

FIG. 8 is a diagram illustrating an example of a circuit configuration of the driver SLDRVa in the semiconductor memory device 1a according to the second embodiment.

FIG. 8 illustrates NAND string groups NSG1, NSG2, . . . , and NSGn including one or more NAND strings NS in the memory cell array 10.

First, each NAND string NS in the NAND string group NSGk is connected to a node N1_k. Here, the symbol "k" represents an integer from 1 to n. The node N1_k and a node N1_(k+1) are connected via a resistor R_k. Here, the symbol "k" represents an integer from 1 to (n−1). The nodes N1_1 to N1_n correspond to the source line SL.

The driver SLDRVa includes a current supply unit 191, a discharge path setting unit 192, and a reference voltage setting unit 193. However, any of the respective circuits of these units may be provided separately in other devices.

The current supply unit 191 includes p-channel MOS transistors Tr11 and Tr12, a current source CS, and high breakdown voltage n-channel MOS transistors Tr13_1, Tr13_2, . . . , and Tr13_n.

A voltage VDDSA is applied to the first terminal of the transistor Tr11, and the second terminal of the transistor Tr11 is connected to the node N2. The gate of the transistor Tr11 is connected to the node N3. The voltage VDDSA is applied to the first terminal of the transistor Tr12, and the second terminal and the gate of the transistor Tr12 are connected to the node N3. An input terminal of the current source CS is connected to the node N3, and an output terminal of the current source CS is grounded. The first terminal of each of the transistors Tr13_1 to Tr13_n is connected to the node N2. The second terminal of the transistor Tr13_k is connected to the node N1_k, and a control signal supplied by, for example, the sequencer 16 is applied to the gate of the transistor Tr13_k. Here, the symbol "k" represents an integer from 1 to n. Further, the control signals applied to the gates of the transistors Tr13_1 to Tr13_n, respectively, may be independently controlled by, for example, the sequencer 16. With such a circuit configuration, a constant current is supplied from the second terminal of the transistor Tr11 to the node N2. The constant current is supplied to the node N1 connected to the transistor Tr13 among the nodes N1_1 to N1_n through the transistor Tr13, which is in the on state among the transistors Tr13_1 to Tr13_n.

The discharge path setting unit 192 includes high breakdown voltage n-channel MOS transistors Tr14_1, Tr14_2, . . . , and Tr14_n.

The first terminal of the transistor Tr14_k is connected to the node N1_k, and the second terminal of the transistor Tr14_k is connected to the node N4. The control signal supplied by, for example, the sequencer 16 is applied to the gate of the transistor Tr14_k. Here, the symbol "k" represents an integer from 1 to n. Further, the control signals applied to the gates of the transistors Tr14_1 to Tr14_n, respectively, may be independently controlled by, for example, the sequencer 16.

The reference voltage setting unit 193 includes an operational amplifier OA, a high breakdown voltage n-channel MOS transistor Tr15, and n-channel MOS transistors Tr16_1, Tr16_2, . . . , and Tr16_n.

The first terminal of the transistor Tr15 is connected to the node N4, and the second terminal of the transistor Tr15 is connected to the node N5. The inverted signal of a control signal SRCHV_SWMON is applied to the gate of the transistor Tr15. The control signal SRCHV_SWMON is supplied by, for example, the sequencer 16. An inverting input terminal of the operational amplifier OA is connected to the node N5, and a voltage VREF_SRC is applied to a non-inverting input terminal of the operational amplifier OA. The output terminal of the operational amplifier OA is connected to the node N6. The first terminal of each of the transistors Tr16_1 to Tr16_n is connected to the node N4, and the second terminal of each of the transistors Tr16_1 to Tr16_n is connected to the node N7. A voltage VSS is applied to the node N7. The gate of each of the transistors Tr16_1 to Tr16_n is connected to the node N6. With such a circuit configuration, the voltage of the node N4 is maintained at a voltage corresponding to the voltage VREF_SRC.

(2) Schematic Layout of Row Decoder Module and Memory Cell Array

Figure 9:
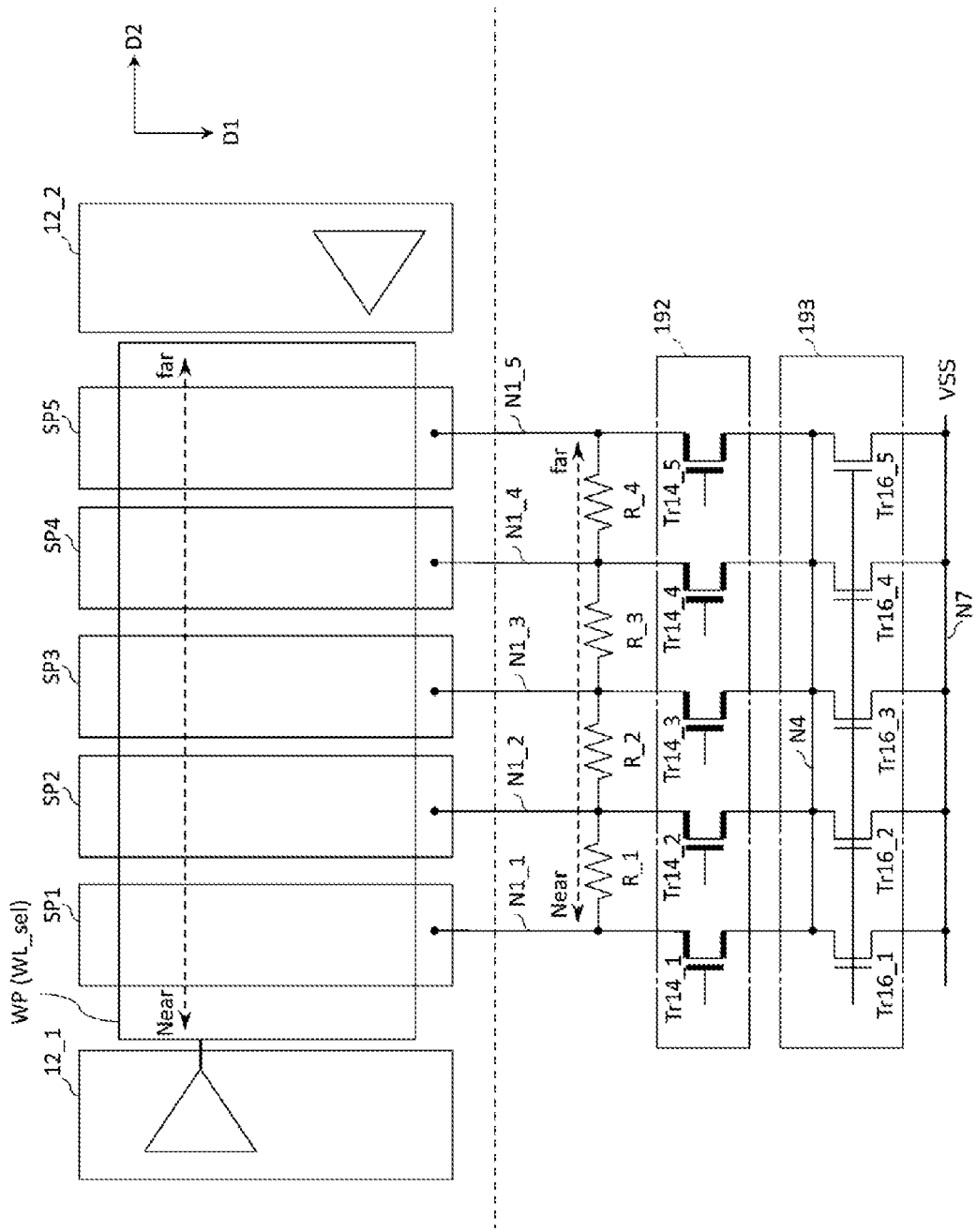
FIG. 9 is a diagram illustrating an example of the layout of a row decoder module, a word line, and a source line in the semiconductor memory device according to the second embodiment.

FIG. 9 is a view illustrating an example of the layout of the row decoder module 12, the word line WL, and the source line SL in the semiconductor memory device 1a according to the second embodiment.

First, the semiconductor memory device 1a includes a semiconductor substrate. Here, two directions parallel to the surface of the semiconductor substrate, for example, two directions orthogonal to each other are defined as a first direction D1 and a second direction D2, and a direction which is, for example, orthogonal to the surface of the semiconductor substrate is defined as a third direction D3. The row decoder module 12 and the memory cell array 10 are formed along the third direction D3. In FIG. 9, in order to facilitate reference to the drawings, only the positional relationship in the first direction D1 and the second direction D2 is accurately illustrated and the positional relationship in the third direction D3 is not necessarily accurately illustrated.

Hereinafter, descriptions will be made on a case where the NAND strings NS in the memory cell array 10 are divided into, for example, five groups of NAND string groups NSG1, NSG2, . . . , and NSG5.

For example, a conductor that functions as a source line SL of each NAND string NS in the NAND string group NSGk is referred to as a conductor SPk. Here, the symbol "k" represents an integer from 1 to 5. Further, in the following description, the memory cell transistors MT in the NAND string group NSGk are referred to as memory cell transistors MT corresponding to the conductor SPk.

The conductors SP1 to SP5 are sequentially provided along the second direction D2 so as to be adjacent to each other with an interval in the order of the conductor SP1, the conductor SP2, . . . , the conductor SP5.

A conductor WP that functions as the word line WL is provided so as to extend in the first direction D1 and the second direction D2 and overlap the conductors SP1 to SP5 in the third direction D3.

The row decoder module 12 includes, for example, row decoder modules 12_1 and 12_2. The row decoder modules 12_1 and 12_2 are provided so as to be adjacent to each another in the order of the row decoder module 12_1, the conductors SP1 to SP5, and the row decoder module 12_2 along the second direction D2. The row decoder module 12_1 may transfer a voltage to the conductor WP.

For example, when the row decoder module 12_1 transfers a voltage to the conductor WP, a distance between the position of the conductor WP to which the voltage is applied and the portion of the conductor WP which is connected to the memory cell transistor MT corresponding to the conductor SPk gets longer as the integer "k" increases from 1 to 5.

That is, a portion of the conductor WP which is connected to the memory cell transistor MT corresponding to the conductor SP1 corresponds to the near end side of the word line WL, and a portion which is connected to the memory cell transistor MT corresponding to the conductor SP5 corresponds to the far end side of the word line WL. Further, the row decoder module 12_2 may also transfer a voltage to a conductor that functions as another word line (not illustrated) provided so as to overlap, for example, the conductor WP in the third direction D3. In the conductor to which the row decoder module 12_2 transfers a voltage, a portion of the conductor connected to the memory cell transistor MT corresponding to the conductor SP1 corresponds to the far end side of the word line WL, and a portion connected to the memory cell transistor MT corresponding to the conductor SP5 corresponds to the near end side of the word line WL.

In the present embodiment, the following description will be made by taking a case where the conductor WP functions as the selected word line WL_sel as an example.

The conductor SP1 corresponds to the near end side of the selected word line WL_sel, and the conductor SP5 corresponds to the far end side of the selected word line WL_sel. The conductor SPk is connected to the node N1_k, and as described above, the conductor SPk and the node N1_k correspond to the source line SL. Here, the symbol "k" represents an integer from 1 to 5.

At this time, since the node N1_1 is connected to the conductor SP1 corresponding to the near end side of the selected word line WL_sel, the node N1_1 is defined to correspond to the near end side of the source line SL. Further, since the node N1_5 is connected to the conductor SP5 corresponding to the far end side of the selected word line WL_sel, the node N1_5 is defined to correspond to the far end side of the source line SL.

Operation Example (1) Example of Control of Voltage of Source Line

Figure 10:
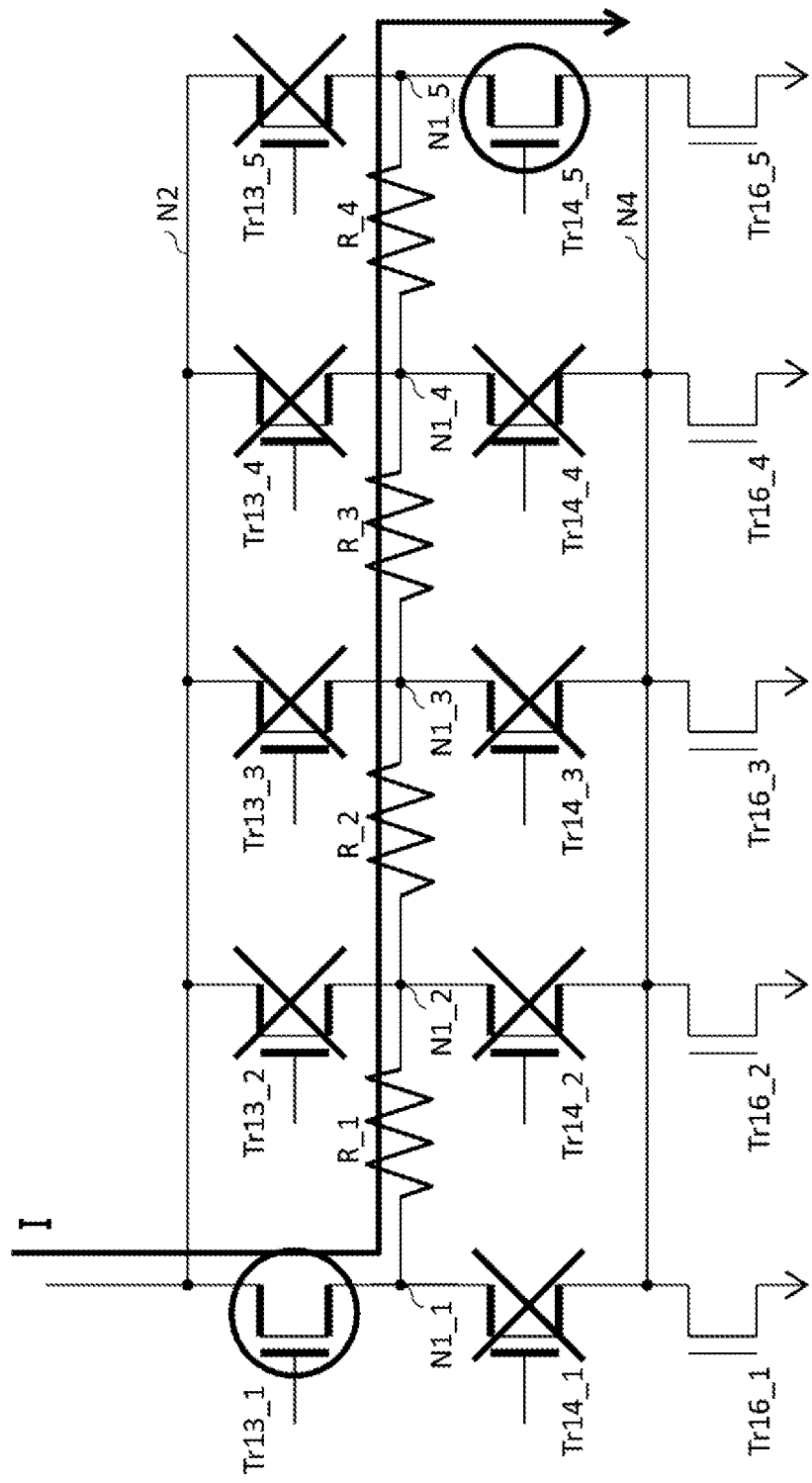
FIG. 10 is a schematic circuit diagram illustrating a first example of on/off control of each of the transistors in the driver of the semiconductor memory device according to the second embodiment.

FIG. 10 is a schematic circuit configuration diagram illustrating a first example of on/off control of the transistors Tr13_1 to Tr13_5 and Tr14_1 to Tr14_5 in the driver SLDRVa in the semiconductor memory device 1a according to the second embodiment illustrated in FIG. 8. Similarly to FIG. 9, descriptions will be made on a case where the NAND strings NS in the memory cell array 10 are divided into NAND string groups NSG1 to NSG5, the node N1_1 corresponds to the near end side of the source line SL, and the node N1_5 corresponds to the far end side of the source line SL. FIG. 10 illustrates an example of the state during the read operation (including the verify operation), and in particular, the state while the voltage is applied to the source line SL during the read operation. The same applies to FIGS. 12 and 14 below.

As described with reference to FIG. 8, the first terminal of each of the transistors Tr13_1 to Tr13_5 is connected to the node N2. Further, the second terminal of the transistor Tr13_k is connected to the node N1_k. Here, the symbol "k" represents an integer from 1 to 5.

As described with reference to FIG. 8, the constant current is supplied to the node N2.

In the example illustrated in FIG. 10, for example, the sequencer 16 controls the transistors Tr13_2 to Tr13_5 to be in the off state so that the transistor Tr13_1 is in the on state. At this time, the current supplied to the node N2 is supplied to the node N1_1 only through the transistor Tr13_1 which is in the on state among the transistors Tr13_1 to Tr13_5.

As described with reference to FIG. 8, the node N1_k and the node N1_(k+1) are connected via the resistor R_k. Here, the symbol "k" represents an integer from 1 to 4. Further, the first terminal of the transistor Tr14_k is connected to the node N1_k, and the second terminal of the transistor Tr14_k is connected to the node N4. Here, the symbol "k" represents an integer from 1 to 5.

In the example illustrated in FIG. 10, for example, the sequencer 16 controls the transistor Tr14_5 to be in the on state so that the transistors Tr14_1 to Tr14_4 are in the off state. At this time, the current supplied to the node N1_1 passes through a resistor R_1, a node N1_2, a resistor R_2, a node N1_3, a resistor R_3, a node N1_4, a resistor R_4, and a node N1_5 in this order so as to be supplied to the node N4 through the transistor Tr14_5. Therefore, a voltage drop occurs in the resistors R_1, R_2, R_3, and R_4, whereby the voltage decreases in the order of the nodes N1_1, N1_2, N1_3, N1_4, and N1_5. The voltage of the node N1_5 is equal to the voltage of the node N4, and is maintained at a voltage corresponding to the voltage VREF_SRC.

Figure 11:
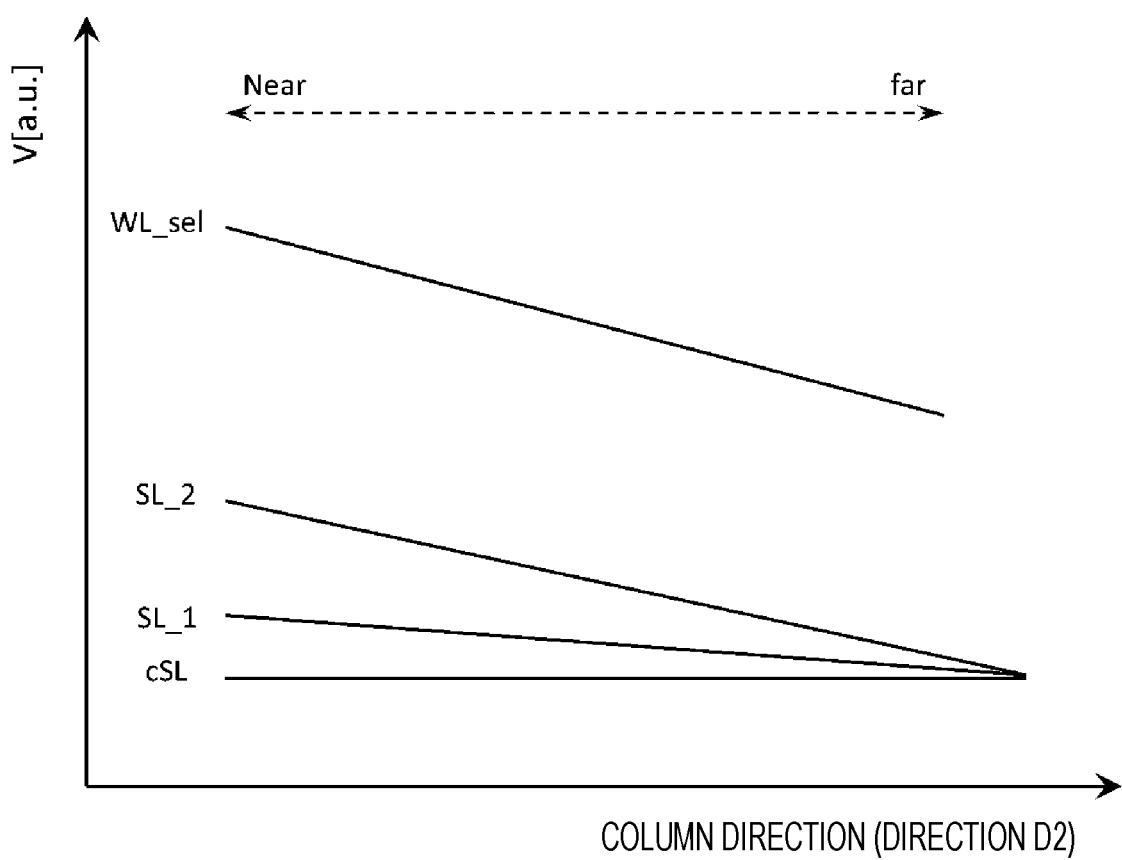
FIG. 11 is a graph illustrating an example of control of a voltage of a source line, which is implemented by on/off control of each of the transistors illustrated in FIG. 10.

FIG. 11 is a graph illustrating an example of control of the voltage of the source line SL, which is implemented by the on/off control of the transistors Tr13_1 to Tr13_5 and Tr14_1 to Tr14_5 illustrated in FIG. 10.

As described above in detail, when a voltage is applied to the selected word line WL_sel to raise the voltage of the selected word line WL_sel, the time until the voltage at the near end side portion of the selected word line WL_sel is stabilized is relatively short, and the time until the voltage of the far end side portion of the selected word line WL_sel is stabilized is relatively long. Therefore, at a certain timing when the voltage is applied to the selected word line WL_sel, the voltage of the selected word line WL_sel gradually decreases from the near end side to the far end side of the selected word line WL_sel, as illustrated in FIG. 11.

For example, by performing the on/off control of each transistor as illustrated in FIG. 10, it is also possible to control the voltage of the source line SL so as to gradually decrease to the voltage corresponding to the voltage VREF_SRC from the near end side to the far end side of the source line SL, as indicated by the symbol "SL_1" of FIG. 11. Further, the symbol "cSL" illustrated in FIG. 11 represents a case where the voltage of the source line SL becomes constant at a voltage corresponding to the voltage VREF_SRC from the near end side to the far end side.

In addition, by configuring, for example, the current source CS so as to increase the current output from the current source CS and increasing the current supplied to the node N2, it is possible to increase the voltage drop at the resistors R_1, R_2, R_3, and R_4, respectively, which have been described with reference to FIG. 10. In this case, as indicated by the symbol "SL_2" of FIG. 11, the rate increases at which the voltage of the source line SL gradually decreases to the voltage corresponding to the voltage VREF_SRC from the near end side to the far end side of the source line SL. By controlling the current supplied to the node N2 in this manner, it is possible to match, for example, the above-described rate at which the voltage of the selected word line WL_sel gradually decreases from the near end side to the far end side of the selected word line WL_sel, and the rate at which the voltage of the source line SL gradually decreases from the near end side to the far end side of the source line SL.

Figure 12:
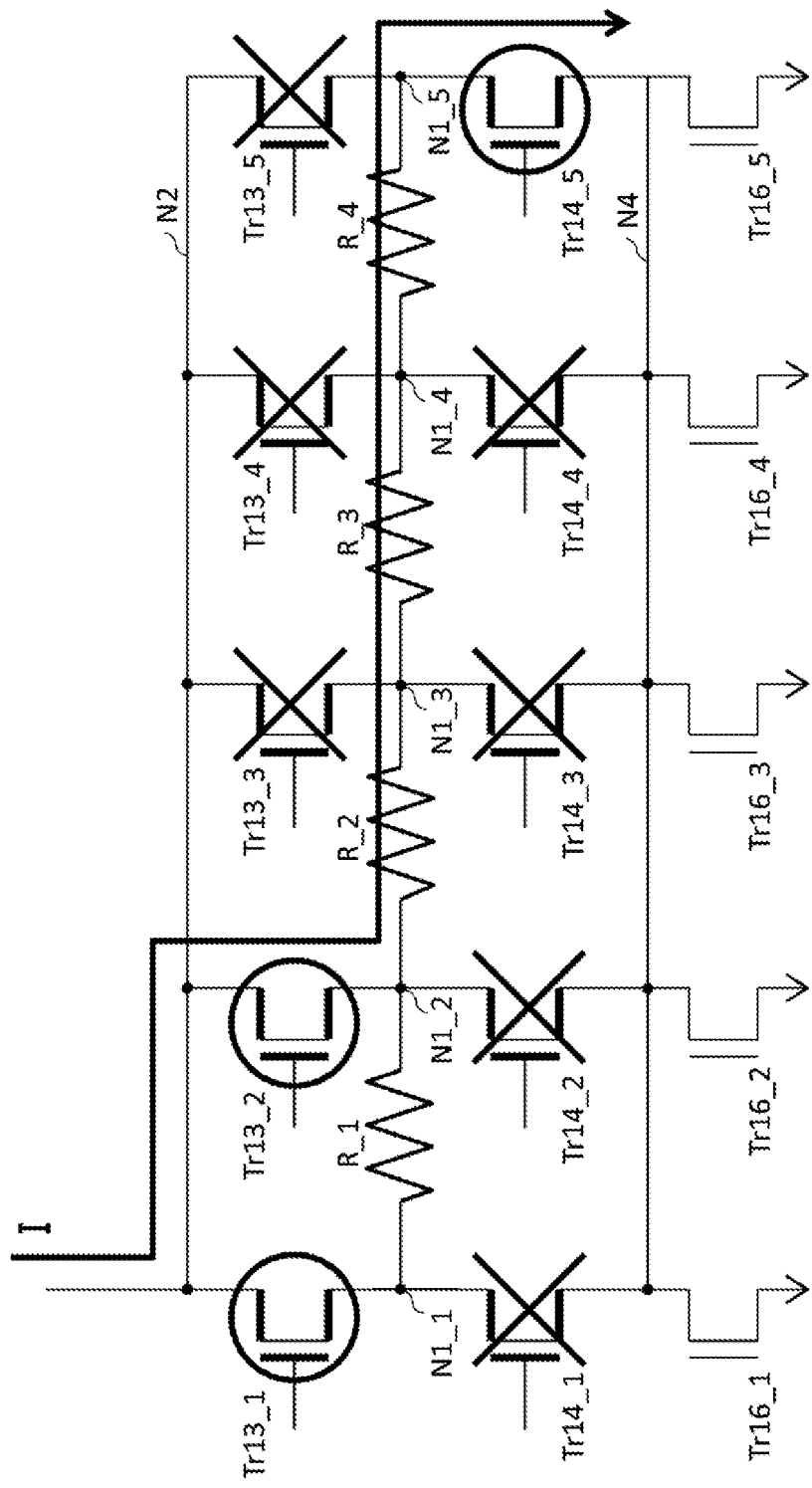
FIG. 12 is a schematic circuit diagram illustrating a second example of on/off control of each of the transistors in the driver of the semiconductor memory device according to the second embodiment.

FIG. 12 is a schematic circuit diagram illustrating a second example of the on/off control of the transistors Tr13_1 to Tr13_5 and Tr14_1 to Tr14_5 in the driver SLDRVa in the semiconductor memory device 1a according to the second embodiment illustrated in FIG. 8. Similarly to FIG. 10, descriptions will be made on a case where the NAND strings NS in the memory cell array 10 are divided into NAND string groups NSG1 to NSG5, the node N1_1 corresponds to the near end side of the source line SL, and the node N1_5 corresponds to the far end side of the source line SL.

In the example illustrated in FIG. 12, for example, the sequencer 16 controls the transistors Tr13_3 to Tr13_5 to be in the off state so that the transistors Tr13_1 and Tr13_2 are in the on state. Further, for example, the sequencer 16 controls the transistor Tr14_5 to be in the on state so that the transistors Tr14_1 to Tr14_4 are in the off state.

At this time, the current supplied to the node N2 is supplied to the node N1_2 only through the transistor Tr13_2 which is in the on state among the transistors Tr13_1 to Tr13_5. The current supplied to the node N1_2 passes through the resistor R_2, the node N1_3, the resistor R_3, the node N1_4, the resistor R_4, and the node N1_5 in this order so as to be supplied to the node N4 through the transistor Tr14_5. Therefore, a voltage drop occurs in the resistors R_2, R_3, and R_4, whereby the voltage decreases in the order of the nodes N1_2, N1_3, N1_4, and N1_5.

Further, since the transistors Tr13_1 and Tr13_2 are in the on state, the node N1_1 and the node N1_2 are at the same voltage. The voltage of the node N1_5 is equal to the voltage of the node N4, and is maintained at a voltage corresponding to voltage VREF_SRC.

Figure 13:
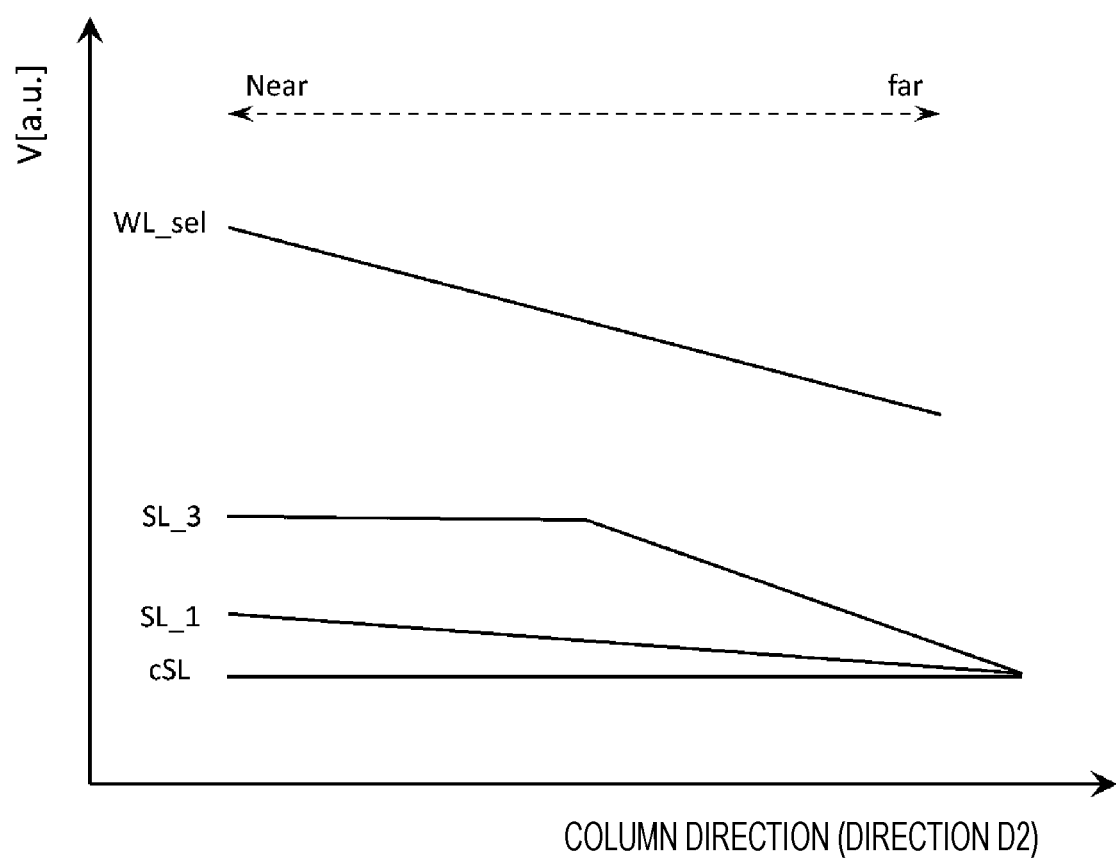
FIG. 13 is a graph illustrating an example of control of a voltage of a source line, which is implemented by on/off control of each of the transistors illustrated in FIG. 12.

FIG. 13 is a graph illustrating an example of control of the voltage of the source line SL, which is implemented by the on/off control of the transistors Tr13_1 to Tr13_5 and Tr14_1 to Tr14_5 illustrated in FIG. 12.

As described with reference to FIG. 11, as illustrated in FIG. 13, the voltage of the selected word line WL_sel gradually decreases from the near end side to the far end side of the selected word line WL_sel.

For example, by performing the on/off control of each transistor as illustrated in FIG. 12, it is possible to maintain the voltage of the source line SL to be constant from the near end side to the far end side of the source line SL in the section corresponding to the transistor which is in the on state among the transistors Tr13_1 to Tr13_5, and then control the voltage of the source line SL so as to gradually decrease to the voltage corresponding to the voltage VREF_SRC, as indicated by the symbol "SL_3" of FIG. 13.

Figure 14:
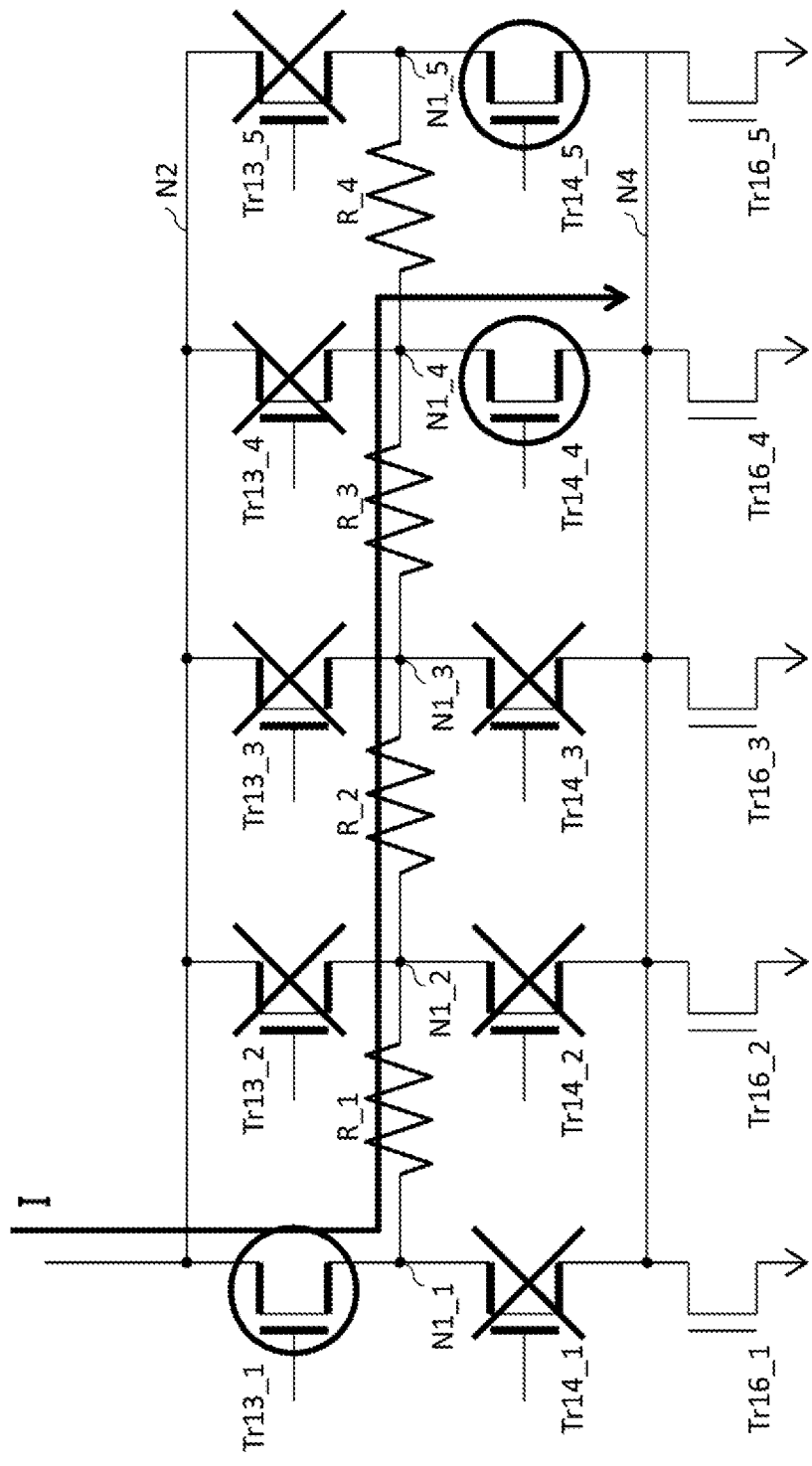
FIG. 14 is a schematic circuit diagram illustrating a third example of on/off control of each of the transistors in the driver of the semiconductor memory device according to the second embodiment.

FIG. 14 is a schematic circuit diagram illustrating a third example of the on/off control of the transistors Tr13_1 to Tr13_5 and Tr14_1 to Tr14_5 in the driver SLDRVa in the semiconductor memory device 1a according to the second embodiment illustrated in FIG. 8. Similarly to FIG. 10, descriptions will be made on a case where the NAND strings NS in the memory cell array 10 are divided into NAND string groups NSG1 to NSG5, the node N1_1 corresponds to the near end side of the source line SL, and the node N1_5 corresponds to the far end side of the source line SL.

In the example illustrated in FIG. 14, for example, the sequencer 16 controls the transistors Tr13_2 to Tr13_5 to be in the off state so that the transistor Tr13_1 is in the on state. Further, for example, the sequencer 16 controls the transistors Tr14_4 and Tr14_5 to be in the on state so that the transistors Tr14_1 to Tr14_3 are in the off state.

At this time, the current supplied to the node N2 is supplied to the node N1_1 only through the transistor Tr13_1 which is in the on state among the transistors Tr13_1 to Tr13_5. The current supplied to the node N1_1 passes through the resistor R_1, the node N1_2, the resistor R_2, the node N1_3, the resistor R_3, and the node N1_4 in this order so as to be supplied to the node N4 through the transistor Tr14_4. Therefore, a voltage drop occurs in the resistors R_1, R_2, and R_3, whereby the voltage decreases in the order of the nodes N1_1, N1_2, N1_3, and N1_4.

Further, since the transistors Tr14_4 and Tr14_5 are in the on state, the nodes N1_4 and N1_5 are at the same voltage. The voltages of the nodes N1_4 and N1_5 are equal to the voltage of node N4, and are maintained at a voltage corresponding to the voltage VREF_SRC.

Figure 15:
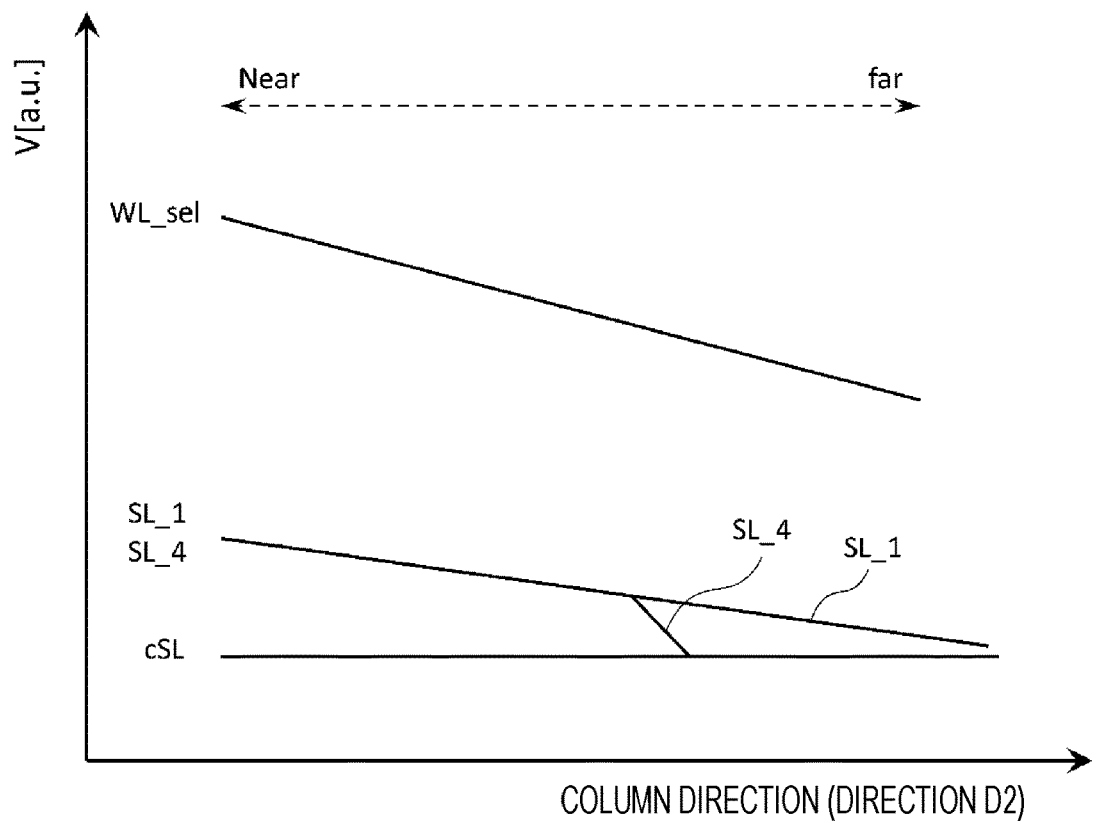
FIG. 15 is a graph illustrating an example of control of a voltage of a source line, which is implemented by on/off control of each of the transistors illustrated in FIG. 14.

FIG. 15 is a graph illustrating an example of control of the voltage of the source line SL, which is implemented by the on/off control of the transistors Tr13_1 to Tr13_5 and Tr14_1 to Tr14_5 illustrated in FIG. 14.

As described with reference to FIG. 11, as illustrated in FIG. 15, the voltage of the selected word line WL_sel gradually decreases from the near end side to the far end side of the selected word line WL_sel.

For example, by performing the on/off control of each transistor as illustrated in FIG. 14, it is possible to perform a control such that the voltage of the source line SL is gradually decreased to the voltage corresponding to the voltage VREF_SRC from the near end side to the far end side of the source line SL, and then maintained at a voltage corresponding to the voltage VREF_SRC in the section corresponding to the transistor in the on state among the transistors Tr14_1 to Tr14_5, as indicated by the symbol "SL_4" of FIG. 15.

By combining the control of the voltage of the source line SL described with reference to FIGS. 10 to 15, for example, even when the rate is not constant at which the voltage of the selected word line WL_sel gradually decreases from the near end side to the far end side of the selected word line WL_sel, it is possible to correspond the state of the voltage change from the near end sides to the far end sides of the selected word line WL_sel and the source line SL. Further, the on/off control of each transistor by, for example, the sequencer 16 described above may be executed based on a row address.

(2) Examples of Various Voltages Used in Read Operation

Figure 16:
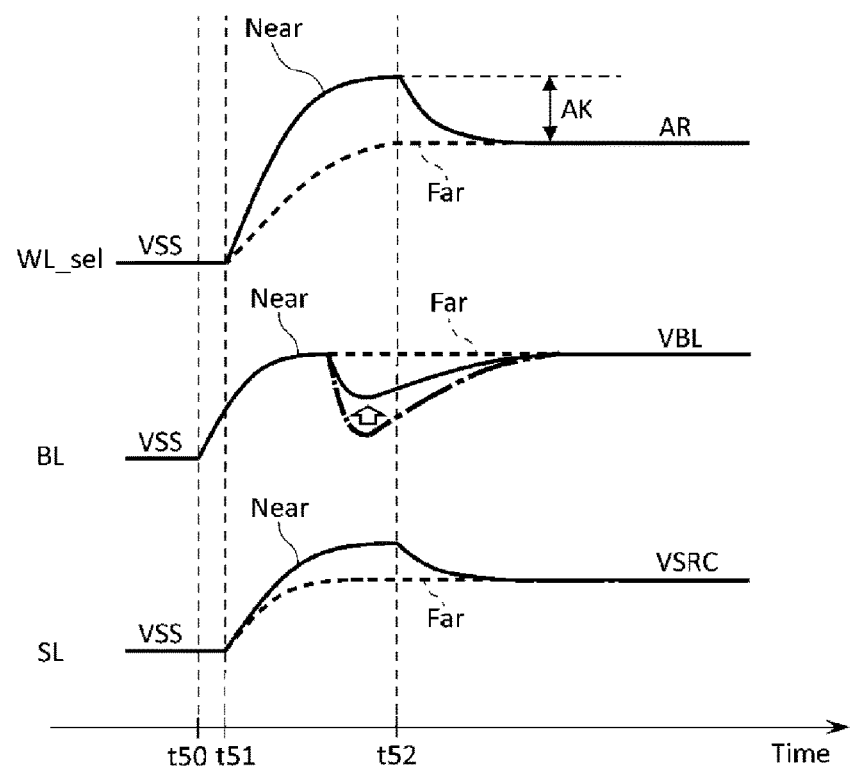
FIG. 16 is a timing chart illustrating an example of changes in voltages that are applied to various circuit elements during a read operation in the semiconductor memory device according to the second embodiment.

FIG. 16 is a timing chart illustrating an example of changes in voltages that are applied to various circuit elements during a read operation in the semiconductor memory device 1a according to the second embodiment. In addition, while descriptions will be made below on a case where a read operation is performed using a read voltage, the same applies to a read operation using a verify voltage.

As described above, the application of the voltage to the source line SL is executed by the control of the voltage generation circuit 18 and the driver SLDRVa by the sequencer 16. In the corresponding control, the control of the voltage of the source line SL, which has been described in detail with reference to FIGS. 10 to 15, is performed.

In the example illustrated in FIG. 16, the voltage applied to the word line WL_sel, the bit line BL, and the source line SL, respectively, at the start of the read operation is VSS.

First, the voltage VBL is applied to the bit line BL at time t50.

Thereafter, at time t51, a voltage obtained by adding the kick amount AK to the read voltage AR, which is the target voltage, is applied to the selected word line WL_sel, and thereafter, at time t52, the read voltage AR is applied to the selected word line WL_sel. Thus, the kick operation is performed on the selected word line WL_sel. By the kick operation, as illustrated in FIG. 16, the voltage ("Near") at the near end side portion of the selected word line WL_sel may become higher than the voltage which is stabilized by the read voltage AR before it is stabilized by the read voltage AR. In such a case, as described with reference to FIG. 7, discharge of the bit line BL corresponding to the near end side portion of the selected word line WL_sel may occur.

In the example illustrated in FIG. 16, at time t51, a voltage is applied to the source line SL so that the voltage gradually decreases from the voltage corresponding to the voltage obtained by adding the kick amount AK to the voltage VSRC to the voltage corresponding to the voltage VSRC, for example, from the near end side ("Near") to the far end side ("Far") of the source line SL. Thereafter, for example, at time t52, a constant voltage VSRC is applied from the near end side to the far end side of the source line SL. In this manner, an operation according to the kick operation on the selected word line WL_sel is performed on the source line SL. Further, such an operation will be described below as a kick operation. In the following description, the kick voltage in the operation is a voltage that is described as being applied to the source line SL at time t51, the kick amount in the operation is the kick amount AK, and the target voltage therein is the voltage VSRC.

This makes it possible to prevent the expansion of the voltage difference between the gate and the source of the selected memory cell transistor MT, which has been described with reference to FIG. 7, and hence, the discharge of bit line BL described above can be prevented as illustrated in FIG. 16. The dashed-dotted line regarding the bit line BL illustrated in FIG. 16 will be described later.

Further, the voltage VBL is set, for example, to be always greater than the voltage applied to the source line SL. Alternatively, as described with reference to FIG. 6 in the first embodiment, the kick operation may be performed on the bit line BL according to the kick operation on the selected word line WL_sel.

Further, the control of the voltage applied to the source line SL is not limited to that described above. For example, the voltage applied to the source line SL may be made to be changed at any timing to a voltage which is controlled such that the state of the voltage change from the near end side to the far end side of the selected word line WL_sel at that time, and the state of the voltage change from the near end side to the far end side of the source line SL correspond to each other.

As described above, the kick operation performed on the source line SL corresponds to the kick operation performed on the selected word line WL_sel. For example, in the example described above, the period during which the kick voltage is applied to the selected word line WL_sel and the period during which the kick voltage is applied to the source line SL are the same period. Further, the kick amount in the kick operation for the selected word line WL_sel matches the kick amount in the kick operation for the source line SL. However, the kick operation on the source line SL performed according to the kick operation on the selected word line WL_sel is not limited to this. For example, the kick amount in the kick operation for the selected word line WL_sel and the kick amount in the kick operation for the source line SL may not necessarily coincide with each other. Further, the timing at which the kick voltage or the target voltage is applied to each of the selected word line WL_sel and the source line SL may not coincide with each other. For example, the timing at which the kick voltage is applied to the source line SL may correspond to the timing at which the kick voltage is applied to the selected word line WL_sel. Also, as described above with reference to FIG. 6, for example, the kick operation on the source line SL may be completed at least before the corresponding control signal STB is asserted.

[Effect]

Figure 17:
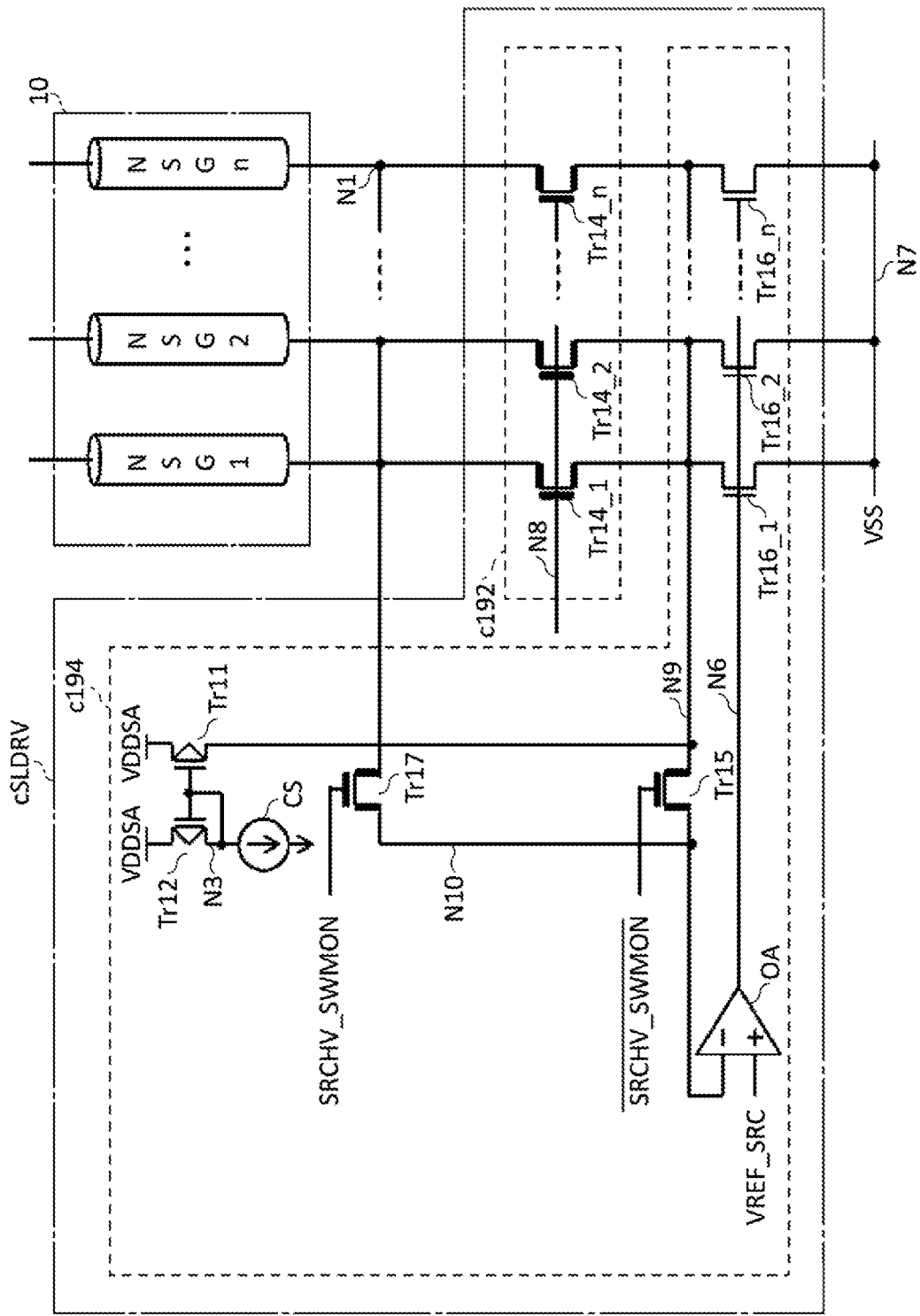
FIG. 17 is a diagram illustrating an example of a circuit configuration of a driver in a semiconductor memory device according to a comparative example.

FIG. 17 is a diagram illustrating an example of a circuit configuration of a driver cSLDRV in a semiconductor memory device according to a comparative example.

NAND string groups NSG1 to NSGn are commonly connected to the node N1. In the comparative example of the second embodiment, the node N1 corresponds to the source line SL.

The driver cSLDRV includes a discharge unit c192 and a reference voltage setting unit c194.

The discharge unit c192 includes high-breakdown voltage n-channel MOS transistors Tr14_1, Tr14_2, . . . , and Tr14_n.

The first terminal of the transistor Tr14_k is connected to the node N1, and the second terminal of the transistor Tr14_k is connected to the node N9. The gate of the transistor Tr14_k is connected to the node N8. Here, the symbol "k" represents an integer from 1 to n. The same control signal is applied to the gates of the transistors Tr14_1 to Tr14_n by, for example, the sequencer 16.

The reference voltage setting unit c194 includes p channel MOS transistors Tr11 and Tr12, a current source CS, an operational amplifier OA, high breakdown voltage n channel MOS transistors Tr15 and Tr17, and n channel MOS transistors Tr16_1, Tr16_2, . . . and Tr16_n.

As described with reference to FIG. 8, the voltage VDDSA is applied to the first terminal of the transistor Tr11, and the gate of the transistor Tr11 is connected to the node N3. Further, the voltage VDDSA is applied to the first terminal of the transistor Tr12, and the second terminal and the gate of the transistor Tr12 are connected to the node N3. In addition, an input terminal of the current source CS is connected to the node N3, and an output terminal of the current source CS is grounded. In the example illustrated in FIG. 17, the second terminal of the transistor Tr11 is connected to the node N9.

The first terminal of the transistor Tr15 is connected to the node N9, and the second terminal of the transistor Tr15 is connected to the node N10. The inverted signal of a control signal SRCHV_SWMON is applied to the gate of the transistor Tr15. The control signal SRCHV_SWMON is supplied by, for example, the sequencer 16. An inverting input terminal of the operational amplifier OA is connected to the node N10, and the voltage VREF_SRC is applied to a non-inverting input terminal of the operational amplifier OA. An output terminal of the operational amplifier OA is connected to the node N6. The first terminal of each of the transistors Tr16_1 to Tr16_n is connected to the node N9, and the second terminal of each of the transistors Tr16_1 to Tr16_n is connected to the node N7. The voltage VSS is applied to the node N7. The gate of each of the transistors Tr16_1 to Tr16_n is connected to the node N6. The first terminal of the transistor Tr17 is connected to the node N1, and the second terminal of the transistor Tr17 is connected to the node N10. The control signal SRCHV_SWMON is applied to the gate of the transistor Tr17. With such a circuit configuration, the voltage of the node N1 is maintained at a voltage corresponding to the voltage VREF_SRC. As a result, in the example illustrated in FIG. 17, the voltage of the source line SL may be controlled so as to be constant at a voltage corresponding to the voltage VREF_SRC from the near end side to the far end side. In this case, as indicated by the dashed-dotted line in FIG. 16 with respect to the bit line BL, the amount of discharge of the bit line BL corresponding to the near end side portion of the selected word line WL_sel is large.

In the meantime, in the semiconductor memory device 1a according to the second embodiment, as described in detail with reference to FIGS. 10 to 15, the voltage of the source line SL may be controlled to gradually change from the near end side to the far end side of the source line SL. Therefore, in the semiconductor memory device 1a, a voltage may be applied to the source line SL so that, for example, when a kick operation is performed on the selected word line WL_sel, the state of voltage change from the near end side to the far end side of the selected word line WL_sel corresponds to the state of voltage change from the near end side to the far end side of the source line SL.

As a result, in the semiconductor memory device 1a, it is possible to prevent the expansion of the voltage difference between the gate and the source of the selected memory cell transistor MT which has been described with reference to FIG. 7. Therefore, as illustrated in FIG. 16, the discharge of the bit line BL can be prevented from the case of the comparative example. As a result, the time required to charge the bit line BL described with reference to FIG. 7 may be shortened and, for example, speeding up of the read operation may be achieved in the semiconductor storage device 1a.

Further, in the semiconductor memory device 1a, the voltage of the source line SL is not unnecessarily raised in the kick operation on the source line SL as described above. Therefore, in the semiconductor memory device 1a, a constant voltage VSRC is applied from the near end side to the far end side of the source line SL after the kick operation, and the time until the voltage of the source line SL is stabilized is shortened. Therefore, it is possible, for example, to speed up the read operation in the semiconductor memory device 1a.

Other Embodiments

Respective units described as the configuration in the semiconductor memory device according to the first embodiment and the second embodiment may be implemented by either hardware or software, or may be implemented by a combination of hardware and software.

In the first and second embodiments described above, when the phrase "identical and coincident" is used, the phrase may include the case where an error in the range of design is included.

Further, in a case where it is described that a certain voltage is applied or supplied, the case includes both of performing a control to apply or supply the voltage and actually applying or supplying the voltage. In addition, applying or supplying a certain voltage may include applying or supplying a voltage of, for example, 0V.

In the present specification, the term "connection" indicates an electrical connection, and does not exclude, for example, the passage of another element interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell;
a word line connected to the memory cell;
a source line connected to the memory cell; and
a control circuit configured to, during a read operation on the memory cell:
  apply a first voltage to the word line, apply a second voltage greater than the first voltage to the word line after applying the first voltage to the word line, and apply a third voltage which is greater than the first voltage and smaller than the second voltage to the word line after applying the second voltage to the word line;
  apply a fourth voltage to the source line according to a timing at which the second voltage is applied to the word line, and apply a fifth voltage smaller than the fourth voltage to the source line after applying the fourth voltage to the source line;
  apply a seventh voltage greater than the third voltage to the word line after applying the third voltage to the word line, and apply an eighth voltage which is greater than the third voltage and smaller than the seventh voltage to the word line after applying the seventh voltage to the word line; and
  apply a ninth voltage greater than the fifth voltage to the source line according to a timing at which the seventh voltage is applied to the word line after applying the fifth voltage to the source line, and apply the fifth voltage to the source line after applying the ninth voltage to the source line.

2. The semiconductor memory device according to claim 1, further comprising:
a sense amplifier connected to the memory cell,
wherein the sense amplifier is configured to sense data stored in the memory cell while the third voltage is applied to the word line.

3. The semiconductor memory device according to claim 1, wherein the control circuit is configured to apply the fourth voltage to the source line while applying the second voltage to the word line.

4. The semiconductor memory device according to claim 1, wherein a difference in magnitude between the fourth voltage and the fifth voltage is approximately the same as a difference in magnitude between the second voltage and the third voltage.

5. The semiconductor memory device according to claim 1, wherein the control circuit is configured to apply a sixth voltage greater than the fifth voltage after applying the fifth voltage to the source line.

6. The semiconductor memory device according to claim 1, wherein the control circuit is configured to apply the ninth voltage to the source line while applying the seventh voltage to the word line.

7. A semiconductor memory device comprising:
a first memory cell;
a second memory cell;
a first source line connected to the first memory cell;
a second source line connected to the second memory cell;
a first transistor connected to the first source line;
a second transistor connected to the second source line; and
a first resistor having a first end connected to the first source line and a second end connected to the second source line, wherein during a read operation on the first and second memory cells, a first control signal is applied to a gate of the first transistor to turn on the first transistor, and a second control signal different from the first control signal is applied to a gate of the second transistor to turn off the second transistor.

8. The semiconductor memory device according to claim 7, further comprising:

a current supply circuit configured to selectively supply a current to the first source line and the second source line.

9. The semiconductor memory device according to claim 8, wherein the current supply circuit includes:

a current source;

a third transistor connected between the current source and the first source line; and a fourth transistor connected between the current source and the second source line.

10. The semiconductor memory device according to claim 7, wherein a first terminal of the first transistor is connected to the first source line, and a first terminal of the second transistor is connected to the second source line, and a second terminal of the first transistor and a second terminal of the second transistor are connected to each other.

11. The semiconductor memory device according to claim 7, further comprising:

a third memory cell;

a third source line connected to the third memory cell;

a fifth transistor connected to the third source line; and a second resistor having a first end connected to the second source line and a second end connected to the third source line, wherein during a read operation on the first, second, and third memory cells, a third control signal different from one of the first control signal and the second control signal is applied to a gate of the fifth transistor.

12. A method of performing a read operation on a memory cell of a semiconductor memory device comprising a word line connected to the memory cell, and a source line respectively connected to the memory cell, said method comprising:

to the word line, applying a first voltage, applying a second voltage greater than the first voltage after applying the first voltage, and applying a third voltage which is greater than the first voltage and smaller than the second voltage after applying the second voltage;

to the source line, applying a fourth voltage according to a timing at which the second voltage is applied to the word line, and applying a fifth voltage smaller than the fourth voltage after applying the fourth voltage;

to the word line, applying a seventh voltage greater than the third voltage after applying the third voltage, and applying an eighth voltage which is greater than the third voltage and smaller than the seventh voltage after applying the seventh voltage; and to the source line, applying a ninth voltage greater than the fifth voltage according to a timing at which the seventh voltage is applied to the word line after applying the fifth voltage, and applying the fifth voltage after applying the ninth voltage.

13. The method according to claim 12, further comprising:

sensing data stored in the memory cell with a sense amplifier of the semiconductor memory device while the third voltage is applied to the word line.

14. The method according to claim 12, wherein the fourth voltage is applied to the source line while applying the second voltage to the word line.

15. The method according to claim 12, wherein a difference in magnitude between the fourth voltage and the fifth voltage is approximately the same as a difference in magnitude between the second voltage and the third voltage.

16. The method according to claim 12, further comprising:

to the source line, applying a sixth voltage greater than the fifth voltage after applying the fifth voltage.

17. The method according to claim 12, wherein the ninth voltage is applied to the source line while applying the seventh voltage to the word line.

* * * * *